(12) United States Patent
Furuki et al.

(10) Patent No.: US 11,276,707 B2
(45) Date of Patent: Mar. 15, 2022

(54) SEMICONDUCTOR MEMORY DEVICE AND METHOD FOR MANUFACTURING SEMICONDUCTOR MEMORY DEVICE

(71) Applicant: Kioxia Corporation, Minato-ku (JP)

(72) Inventors: Yuichi Furuki, Yokkaichi (JP); Hiroki Yamashita, Kitakami (JP)

(73) Assignee: Kioxia Corporation, Minato-ku (JP)

( * ) Notice: Subject to any disclaimer, the term of this patent is extended or adjusted under 35 U.S.C. 154(b) by 142 days.

(21) Appl. No.: 16/814,740

(22) Filed: Mar. 10, 2020

(65) Prior Publication Data
US 2021/0066342 A1 Mar. 4, 2021

(30) Foreign Application Priority Data
Sep. 2, 2019 (JP) .............................. JP2019-159568

(51) Int. Cl.
| | | |
|---|---|---|
| *H01L 27/11582* | (2017.01) | |
| *H01L 27/11556* | (2017.01) | |
| *H01L 23/544* | (2006.01) | |
| *H01L 27/11526* | (2017.01) | |
| *H01L 23/522* | (2006.01) | |
| *H01L 21/66* | (2006.01) | |

(Continued)

(52) U.S. Cl.
CPC .. *H01L 27/11582* (2013.01); *H01L 21/76877* (2013.01); *H01L 22/12* (2013.01); *H01L 23/528* (2013.01); *H01L 23/5226* (2013.01); *H01L 23/544* (2013.01); *H01L 27/11526* (2013.01); *H01L 27/11556* (2013.01); *H01L 27/11573* (2013.01); *H01L 2223/5442* (2013.01); *H01L 2223/54426* (2013.01)

(58) Field of Classification Search
CPC ......... H01L 27/11582; H01L 21/76877; H01L 22/12; H01L 23/5226; H01L 23/528; H01L 23/544; H01L 27/11526; H01L 27/11556; H01L 27/11573; H01L 2223/5442; H01L 2223/54426; H01L 27/11565; H01L 29/40117
USPC ........................................................ 257/314
See application file for complete search history.

(56) References Cited

U.S. PATENT DOCUMENTS

| | | | |
|---|---|---|---|
| 8,749,078 B2 * | 6/2014 | Murakami | ........ H01L 27/11573 257/797 |
| 9,666,284 B2 * | 5/2017 | Fukano | ..................... G11C 8/08 |

(Continued)

FOREIGN PATENT DOCUMENTS

| | | |
|---|---|---|
| JP | 2012-255756 A | 12/2012 |
| JP | 2017-97056 A | 6/2017 |

*Primary Examiner* — Duy T Nguyen
(74) *Attorney, Agent, or Firm* — Oblon, McClelland, Maier & Neustadt, L.L.P.

(57) ABSTRACT

According to one embodiment, a semiconductor memory device includes a stacked body disposed in a first tier, the stacked body including a plurality of conductive layers stacked via an insulating layer; a first pillar that extends in the stacked body in a stacking direction of the stacked body; a first upper structure disposed in a second tier upper than the first tier; and a misalignment mark for inspecting misalignment between the first tier and the second tier, wherein the misalignment mark includes a second pillar that extends the first tier of the misalignment inspection region in the stacking direction, and a second upper structure disposed in the second tier of the misalignment inspection region and superposed on the second pillar in a top view.

12 Claims, 24 Drawing Sheets

(51) Int. Cl.
*H01L 23/528* (2006.01)
*H01L 21/768* (2006.01)
*H01L 27/11573* (2017.01)

(56) References Cited

U.S. PATENT DOCUMENTS

| | | | |
|---|---|---|---|
| 9,754,895 B1* | 9/2017 | Chao | G06T 7/11 |
| 9,966,284 B2 | 5/2018 | Takakuwa | |
| 10,580,795 B1* | 3/2020 | Luo | H01L 23/53257 |
| 2016/0163732 A1* | 6/2016 | Lim | H01L 27/11582 |
| | | | 257/314 |
| 2017/0154852 A1* | 6/2017 | Yasuda | H01L 21/0274 |
| 2018/0040623 A1* | 2/2018 | Kanakamedala | |
| | | | H01L 27/11548 |
| 2020/0091182 A1* | 3/2020 | Shishido | H01L 27/11575 |

\* cited by examiner

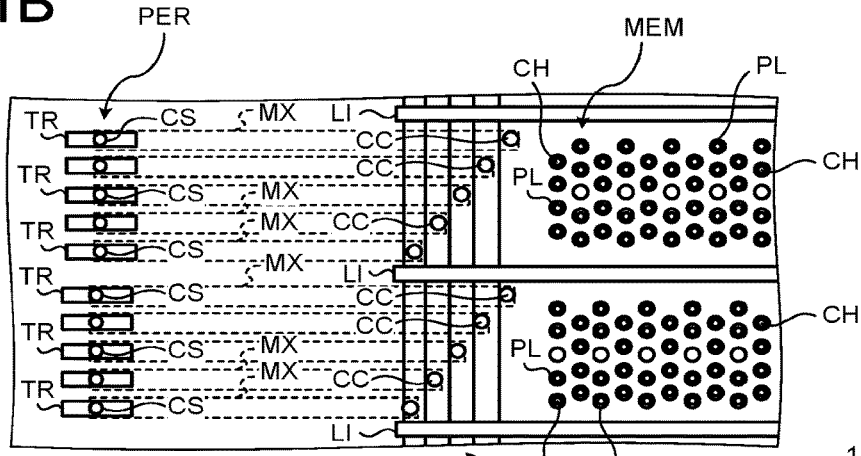
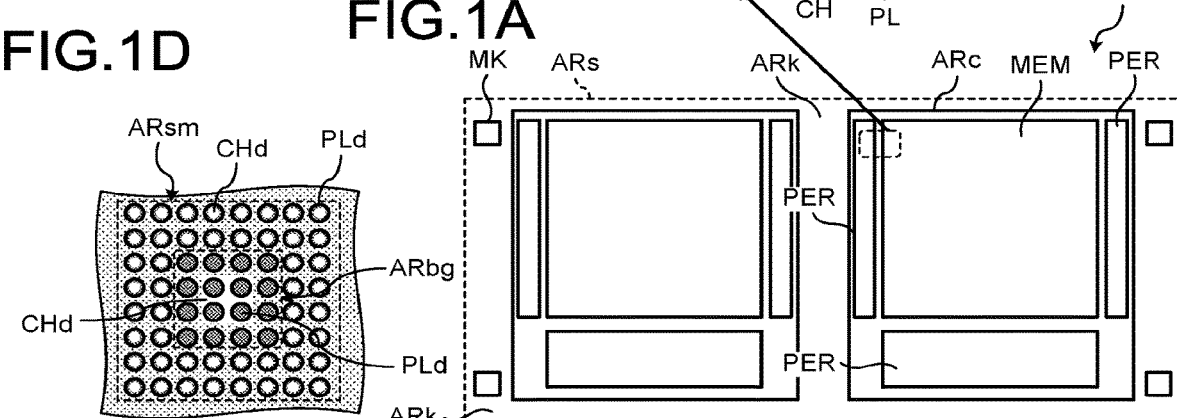
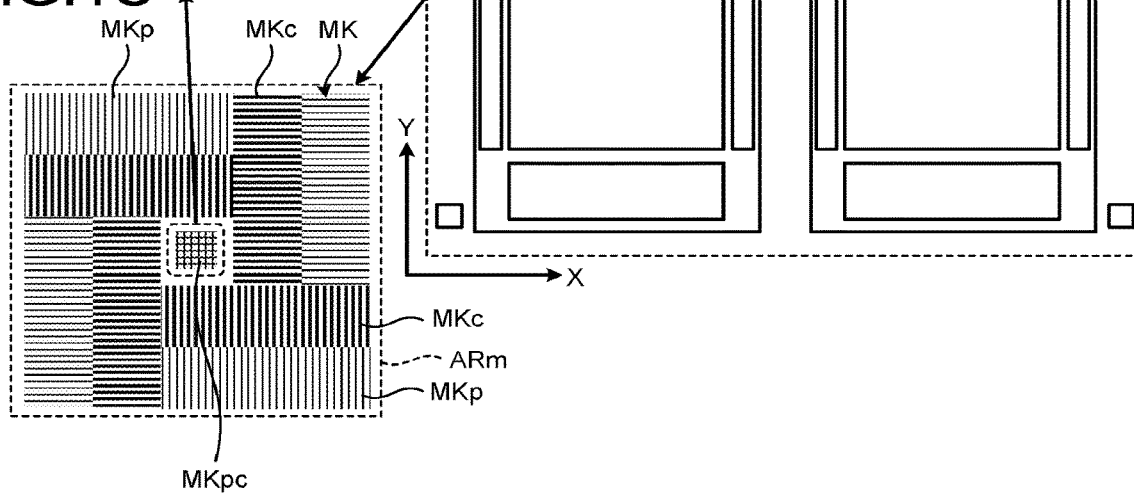

SEMICONDUCTOR MEMORY DEVICE AND METHOD FOR MANUFACTURING SEMICONDUCTOR MEMORY DEVICE

CROSS-REFERENCE TO RELATED APPLICATIONS

This application is based upon and claims the benefit of priority from Japanese Patent Application No. 2019-159568, filed on Sep. 2, 2019; the entire contents of which are incorporated herein by reference.

FIELD

Embodiments described herein relate generally to a semiconductor memory device and a method for manufacturing a semiconductor memory device.

BACKGROUND

A three-dimensional nonvolatile memory has a pillar in which a plurality of memory cells are arranged in a height direction. In the process for manufacturing the three-dimensional nonvolatile memory, when forming upper-layer wiring or the like after forming the pillar, a misalignment mark for inspecting misalignment between the pillar and the upper-layer wiring is employed.

Nevertheless, even if the misalignment inspection is passed, misalignment between the pillar and the upper-layer wiring sometimes occurs in an actual pattern.

BRIEF DESCRIPTION OF THE DRAWINGS

FIGS. 1A to 1D are plan views illustrating a configuration example of a semiconductor memory device according to a first embodiment;

DETAILED DESCRIPTION

Figure 2A:
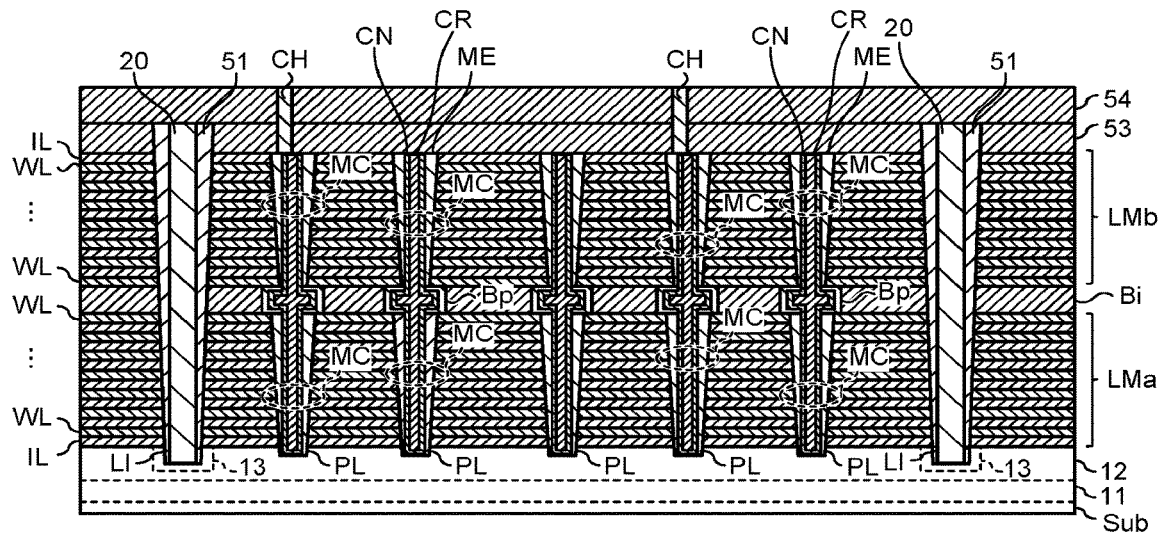
FIGS. 2A to 2C are cross-sectional views illustrating the configuration example of the semiconductor memory device according to the first embodiment.

In general, according to one embodiment, a semiconductor memory device includes: a stacked body disposed in a first tier, the stacked body including a plurality of conductive layers stacked via an insulating layer; a first pillar that extends in the stacked body in a stacking direction of the stacked body, the first pillar having a plurality of memory cells formed at respective intersections of the first pillar and at least a part of the plurality of conductive layers; a first upper structure disposed in a second tier upper than the first tier; and a misalignment mark including a first mark disposed in the first tier of a misalignment inspection region outside the stacked body and a second mark disposed in the second tier of the misalignment inspection region and for inspecting misalignment between the first tier and the second tier. The misalignment mark further includes a second pillar that extends in the first tier of the misalignment inspection region in the stacking direction, and a second upper structure disposed in the second tier of the misalignment inspection region and superposed on the second pillar in a top view.

The present invention will be described below in detail with reference to the accompanying drawings. The present invention is not limited to the following embodiments. Furthermore, the constituent elements of the following embodiments include constituent elements that could easily be conceived by a person skilled in the art or which are substantially the same.

First Embodiment

A first embodiment will be described in detail hereinbelow with reference to the drawings.

(Configuration Example of Semiconductor Memory Device)

FIGS. 1A to 1D are plan views illustrating a configuration example prior to cutting the semiconductor memory device 1 according to the first embodiment into chips. FIG. 1A illustrates a plan view of a shot region ARs where a plurality of semiconductor memory devices 1 are arranged. FIG. 1B illustrates an enlarged view of part of a chip region ARc of the semiconductor memory device 1. FIG. 1C illustrates an enlarged view of part of a kerf region ARk of the semiconductor memory device 1. FIG. 1D is a diagram obtained by further enlarging the part of FIG. 1C.

Note that, in the first embodiment, the up-and-down orientation of the semiconductor memory device 1 is prescribed by taking, as a reference, a tier where a pillar PL, described subsequently, is disposed and a tier where a plug CH, described subsequently, is disposed. That is, the vertical orientation of the semiconductor memory device 1 is prescribed by assuming that a first tier where the pillar PL is disposed is below a second tier where the plug CH is disposed.

As illustrated in FIG. 1A, the semiconductor memory device 1 has a shot region ARs before being cut into chips. The shot region ARs is a region exposed by one-time photolithography and includes a plurality of chip regions ARc. The chip regions ARc are isolated from each other by kerf regions ARk.

After being cut into chips, the semiconductor memory device 1 is substantially equal in size to the chip region ARc. The kerf regions ARk are partially or completely eliminated due to the dicing when the semiconductor memory device 1 is cut into chips.

At least one memory portion MEM and a plurality of peripheral circuits PER are arranged within the chip region ARc. In the example of FIG. 1A, the memory portion MEM is disposed in the center of the chip region Arc, and peripheral circuits PER that include a row decoder (not illustrated) and the like are arranged on both sides of the memory portion MEM in an X direction. Furthermore, a peripheral circuit PER that includes a sense amplifier (not illustrated) and the like is arranged on one side of the memory portion MEM in a Y direction.

A plurality of memory cells are arranged in three dimensions in the memory portion MEM. In other words, the semiconductor memory device 1 is configured as a three-dimensional nonvolatile memory, for example. The peripheral circuits PER contribute to the operation of the memory cells. The row decoder specifies the region in which memory cells which are operation targets are contained. The sense amplifier senses data held by the memory cells.

The kerf region ARk has a plurality of misalignment marks MK arranged therein. The plurality of misalignment marks MK are arranged substantially uniformly within the shot region ARs, for example. In the example of FIG. 1A, the misalignment marks MK are arranged in the top corners, close to the center, and in the bottom corners, at both ends of the shot region ARs in the X direction.

As illustrated in FIG. 1B, the memory portion MEM in the chip region ARc is separated by a plurality of contacts LI that extend in a belt shape in the X direction. The plurality of pillars PL are arranged in the memory portion MEM. A plurality of memory cells are formed on the side surface of the pillars PL. The configuration of the pillars PL and memory cells will be described in detail subsequently. The plugs CH connecting the pillars PL to bit lines (not illustrated) are arranged on the pillars PL. Note that a part of pillars PL without a plug CH are arranged in order to maintain the regular arrangement of the plurality of pillars PL. The memory cells are not formed on the side surface of these pillars PL or are not functioned.

The ends of the memory portions MEM in the X direction have a stepwise shape. Thus, word lines, which are connected to each of the memory cells arranged in a height direction, are led to each step of the stepwise structure. The word lines of each step are connected to contacts CC arranged in each step of the stepwise structure.

The peripheral circuits PER of the chip region ARc include a plurality of transistors TR. Contacts CS are connected to the transistors TR. The contacts CS of the transistors TR are connected by wiring MX, for example, to the contacts CC of the word lines. Thus, a voltage causing the memory cells to operate can be applied from the peripheral circuits PER to the word lines.

As illustrated in FIG. 1C, the misalignment mark MK of the kerf region ARk includes mark MKp, mark MKc, and a mark MKpc.

The mark MKp is formed in parallel with the formation of the pillars PL, in the tier where the pillars PL are formed. The mark MKc is formed in parallel with the formation of the plugs CH, in the tier where the plugs CH are formed. The misalignment mark MK is configured as a grating-type overlay mark (AIM mark) in which grating-like marks MKp and MKc are combined, for example.

However, the misalignment mark MK could also be of another type such as the box-in-box-type, in which box-shaped marks MKp and MKc are combined, or the bar-in-bar-type, in which bar-shaped marks MKp and MKc are combined.

As illustrated in FIG. 1D, the mark MKpc has a region ARsm and a region ARbg, and these regions ARsm and ARbg each include dummy pillars PLd and dummy plugs CHd.

The dummy pillars PLd are formed in parallel with the formation of the pillars PL, in the tier where the pillars PL are formed. The dummy pillars PLd are substantially equal in size to the pillars PL, for example.

The dummy plugs CHd are formed in parallel with the formation of the plugs CH, in the tier where the plugs CH are formed. The dummy plugs CHd in the region ARsm are substantially equal in size to the plugs CH, for example, and are arranged such that one dummy plug CHd is superposed on one dummy pillar PLd. The dummy plugs CHd in the region ARbg are larger in size than the plugs CH, for example, and are arranged such that one dummy plug CHd is superposed over a plurality of dummy pillars PLd.

The mark MKpc is disposed in a position not superposed on the marks MKp and MKc, in the center section of the combined marks MKp and MKc, for example. However, the mark MKpc may be disposed in another position. In either case, the mark MKpc is preferably disposed in the neighborhood of the marks MKp and MKc such as close to the outside edges of the marks MKp and MKc. The region where the marks MKp, MKc, and MKpc are arranged is called the misalignment inspection region ARm.

The misalignment mark MK is used to inspect misalignment between configurations formed in different tiers in the process for manufacturing the semiconductor memory device 1. More specifically, the misalignment mark MK is used to inspect misalignment of the plugs CH with respect to the lower-layer pillars PL during the formation of the plugs CH.

Figure 2B:
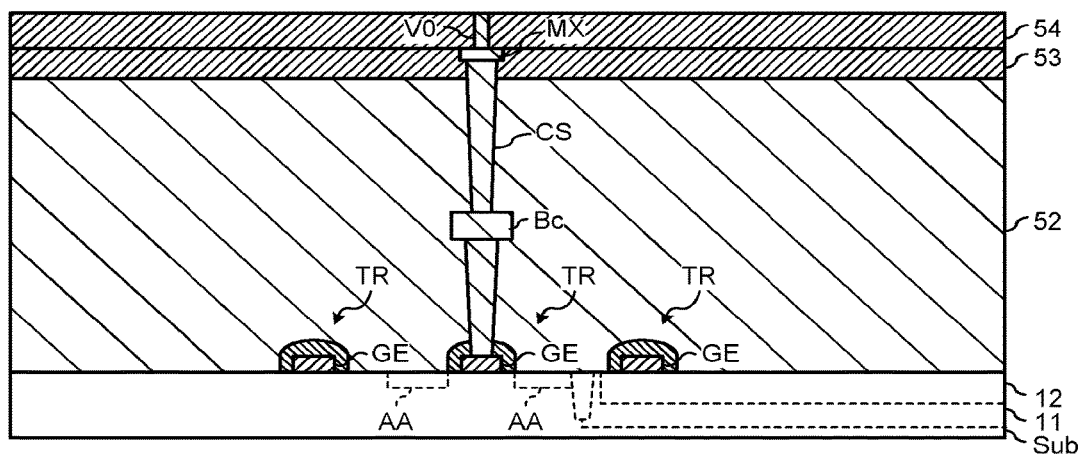
Figure 2C:
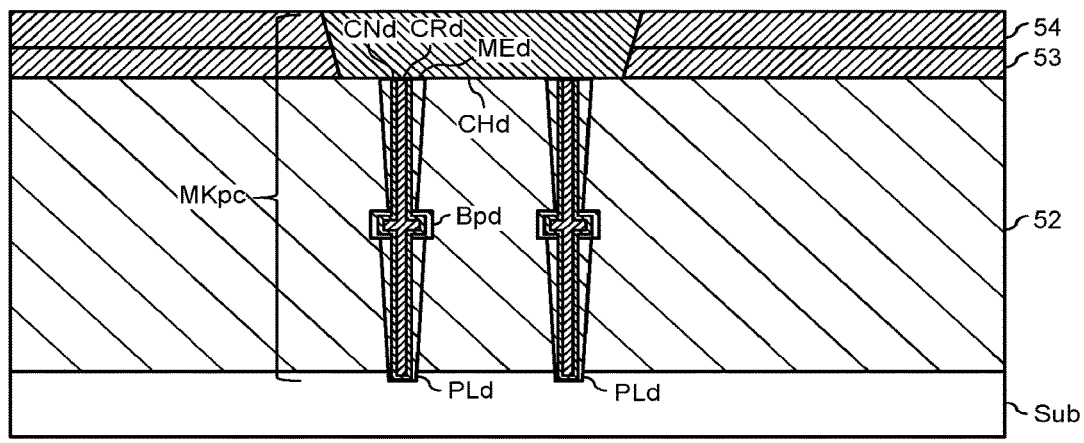

FIGS. 2A to 2C are cross-sectional views illustrating the configuration example of the semiconductor memory device 1 according to the first embodiment. FIG. 2A is a cross-sectional view in a Y direction of the memory portion MEM of the semiconductor memory device 1. FIG. 2B is a cross-sectional view in the Y direction of the peripheral circuit PER of the semiconductor memory device 1. FIG. 2C is a cross-sectional view in the Y direction of the region ARbg of the mark MKpc of the semiconductor memory device 1.

As illustrated in FIG. 2A, the semiconductor memory device 1 includes a substrate Sub such as a silicon substrate, for example. In the memory portion MEM, the substrate Sub has an n-well 11 in a surface layer portion thereof, a p-well 12 in the n-well 11, and a plurality of diffusion regions 13 in the p-well 12.

Disposed on the substrate Sub is a stacked body LMa in which word lines WL as conductive layers and insulating layers IL are alternately stacked in multiple layers. Disposed on the stacked body LMa and via a bonding layer Bi is a stacked body LMb in which word lines WL as conductive layers and insulating layers IL are alternately stacked in multiple layers. The word lines WL are tungsten layers or molybdenum layers, or the like, for example. The insulating layers IL and the bonding layer Bi are $SiO_2$ layers, or the like, for example.

Note that, in the example of FIG. 2A, the stacked bodies LMa and LMb each have seven layers of word lines WL but that there may be any number of layers of word lines WL. Furthermore, the stacked body LMa may also be configured by disposing a select gate line (not illustrated) below the word line WL of the lowermost layer, and the stacked body LMb may also be configured by disposing a select gate line (not illustrated) above the word line WL of the uppermost layer.

The plurality of contacts LI, which penetrate the stacked bodies LMa and LMb and an insulating layer 53 on top of the stacked body LMb and divide the stacked bodies LMa and LMb in the Y direction, are arranged on the diffusion region 13 of the substrate Sub. Each of the contacts LI has an insulating layer 51 that covers the sidewall of the contact LI. A conductive layer 20 is filled into the contact LI, on the inside of the insulating layer 51. The insulating layer 51 is an $SiO_2$ layer, or the like, for example. The conductive layer 20 is a polysilicon layer or a tungsten layer, or the like, for example.

Thus, because the contacts LI with the conductive layer 20 are arranged on the $n^+$ diffusion region 13 of the substrate Sub, the contacts LI function as source line contacts, for example.

The plurality of pillars PL are arranged in the stacked bodies LMa and LMb between two contacts LI. Each of the pillars PL penetrates the stacked bodies LMa and LMb and the bonding layer Bi and are arranged in a matrix shape in the memory portion MEM of the stacked bodies LMa and LMb. Each of the pillars PL has a bonding portion Bp inside the bonding layer Bi.

Each of the pillars PL has a memory layer ME, a channel layer CN, and a core layer CR, in that order, starting from the outer circumferential side of the pillar PL. The channel layer CN is also disposed at the bottom part of the pillar PL. The memory layer ME is, for example, formed by stacking an $SiO_2$ layer/SiN layer/$SiO_2$ layer, the channel layer CN is an amorphous silicon layer or a polysilicon layer, or the like, for example, and the core layer CR is an $SiO_2$ layer, or the like, for example. By providing each of the pillars PL with the memory layer ME and the channel layer CN, a plurality of memory cells MC are formed at the respective intersections between the pillar PL and the word lines WL.

The insulating layer 53 is disposed on the stacked body LMb. An insulating layer 54 is disposed on the insulating layer 53. The channel layer CN of each of the pillars PL is connected to upper-layer wiring such as a bit line via the plug CH that penetrates the insulating layers 53 and 54. The conductive layer 20 of each of the contacts LI is connected to upper-layer wiring via a plug (not illustrated) that penetrates the insulating layer 54.

Note that a tier with the stacked bodies LMa and LMb in which the pillars PL are arranged are sometimes called the first tier. A tier with the insulating layers 53 and 54 in which the plugs CH are arranged are sometimes called the second tier, which is a higher tier than the first tier. Furthermore, the plugs CH arranged in the tier upper than that of the pillars PL are an example of a first upper structure. Bit lines and upper-layer wiring of the bit lines, and the like, which are in a layer still upper than that of the plugs CH, may also be included in the first upper structure.

As illustrated in FIG. 2B, the peripheral circuit PER has a plurality of transistors TR. The respective transistors TR have a gate electrode GE and an active region AA formed in the substrate Sub on both sides of the gate electrode GE. Note that the n-well and/or the p-well (not illustrated) may be disposed in the surface layer of the substrate Sub in a region where the peripheral circuit PER is disposed. The peripheral circuit PER, which includes the transistors TR, is covered with an insulating layer 52 substantially equal in height to the height of the top face of the stacked body LMb in FIG. 2A, for example. In other words, it may be said that the insulating layer 52 is disposed in the same tier as the stacked bodies LMa and LMb included in the first tier.

A contact CS is connected to the gate electrode GE of the transistor TR by penetrating the insulating layer 52 covering the peripheral circuit PER. The contact CS has a bonding portion Bc in a position at the same height as the bonding layer Bi of FIG. 2A. The upper end of the contact CS is connected to a wiring layer MX disposed in the insulating layer 53 covering the insulating layer 52. The wiring layer MX is connected to the contacts CC that are connected to the word lines WL led out in a stepwise shape, as mentioned earlier.

Note that a contact (not illustrated) may also be connected to the active regions AA of the transistor TR by penetrating the insulating layer 52.

The insulating layer 53 is disposed on the insulating layer 52 covering the peripheral circuits PER. An insulating layer 54 is disposed on the insulating layer 53. The wiring layer MX in the insulating layer 53 is connected to upper-layer wiring via the plug V0 that penetrates the insulating layer 54.

As illustrated in FIG. 2C, the mark MKpc has the dummy pillars PLd and the dummy plugs CHd.

The dummy pillars PLd are arranged in the same first tier as the pillars PL and have a similar size and configuration to the pillars PL, for example. That is, the dummy pillars PLd penetrate the insulating layer 52 disposed in a position at the same height as the stacked bodies LMa and LMb in which the pillars PL are arranged. A bonding portion Bpd of the dummy pillar PLd is disposed in a position at the same height as the bonding portion Bp of the pillar PL.

Furthermore, each of the dummy pillars PLd has a plurality of dummy layers MEd, CNd, and CRd, in that order, starting from the outer circumferential side of the dummy pillars PLd. The dummy layer CNd is also disposed at the bottom part of the dummy pillar PLd. Alternatively, both the dummy layers MEd and CNd may also be arranged at the bottom part of the dummy pillar PLd. The dummy layer MEd is formed an $SiO_2$ layer/SiN layer/$SiO_2$ layer, for example, similarly to the aforementioned memory layer ME. The dummy layer CNd is an amorphous silicon layer or a polysilicon layer, or the like, for example, similarly to the aforementioned channel layer CN. The dummy layer CRd is an $SiO_2$ layer, or the like, for example, similarly to the aforementioned core layer CR.

The dummy plugs CHd are arranged in the same second tier as the plugs CH. In other words, the dummy plugs CHd penetrate the insulating layers 53 and 54 where the plugs CH are arranged. Furthermore, the dummy plugs CHd are configured from the same type of conductive material as the plugs CH. However, the dummy plugs CHd may also be configured from an insulating material such as an $SiO_2$ layer or the like.

In addition, the dummy plug CHd is configured larger in size than the plug CH, for example, in the region ARbg. More specifically, the dummy plug CHd is arranged so as to lie across four dummy pillars PLd and be superposed thereon, for example.

Note that the dummy plugs CHd, which are arranged in the second tier upper than the first tier where the dummy pillars PLd are arranged and the insulating layer 52 is disposed, are an example of the second upper structure.

(Method for Manufacturing Semiconductor Memory Device)

An example of a method for manufacturing the semiconductor memory device 1 according to the first embodiment will be described next using FIGS. 3A to 18D.

FIGS. 3A to 17C are cross-sectional views illustrating an example of a procedure in a method for manufacturing the semiconductor memory device 1 according to the first embodiment. A, B, and C in identically numbered drawings denote different parts within the same processing step. In FIGS. 3A to 17C, A corresponds to the part of FIG. 2A, B corresponds to the part of FIG. 2B, and C corresponds to the part of FIG. 2C.

Figure 3A:
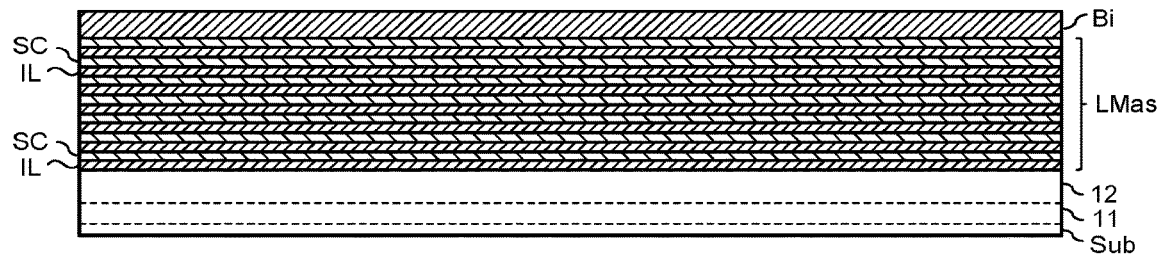
FIGS. 3A to 3C are cross-sectional views illustrating an example of a procedure in a method for manufacturing the semiconductor memory device according to the first embodiment.
Figure 3B:
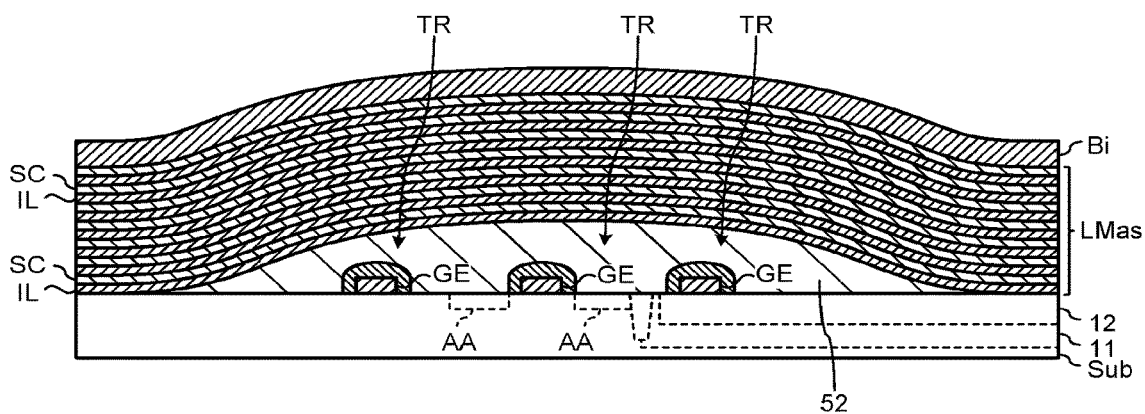

As illustrated in FIG. 3B, the transistors TR each of which include the active regions AA and the gate electrodes GE, and the like, are formed on the substrate Sub.

Figure 3C:
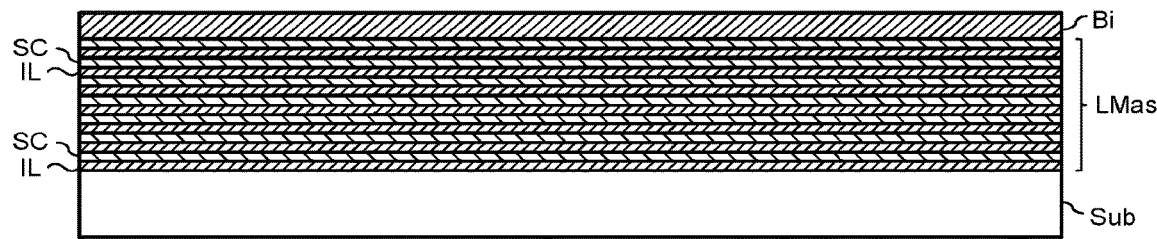

As illustrated in FIGS. 3A to 3C, a stacked body LMas, in which sacrificial layers SC and insulating layers IL are alternately stacked in multiple layers, is formed on the substrate Sub on the surface layer portion of which are formed the n-well 11 and the p-well 12 and the like. The sacrificial layers SC are, for example, insulating layers such as SiN layers and are layers that are subsequently replaced with conductive material to form the word lines WL. The bonding layer Bi is formed on the stacked body LMas.

Figure 4A:
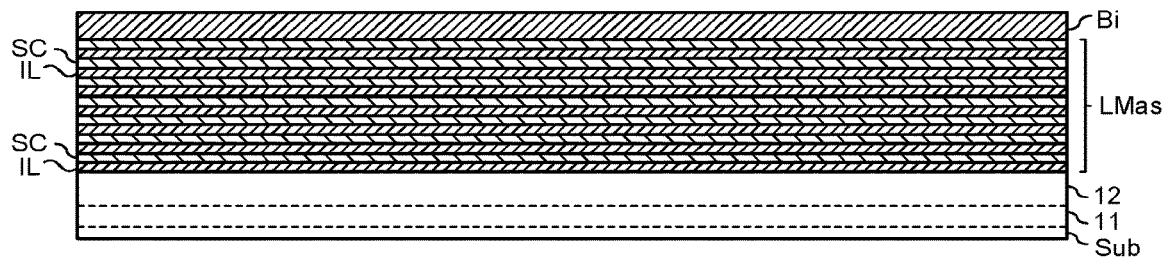
FIGS. 4A to 4C are cross-sectional views illustrating an example of the procedure in the method for manufacturing the semiconductor memory device according to the first embodiment.
Figure 4B:
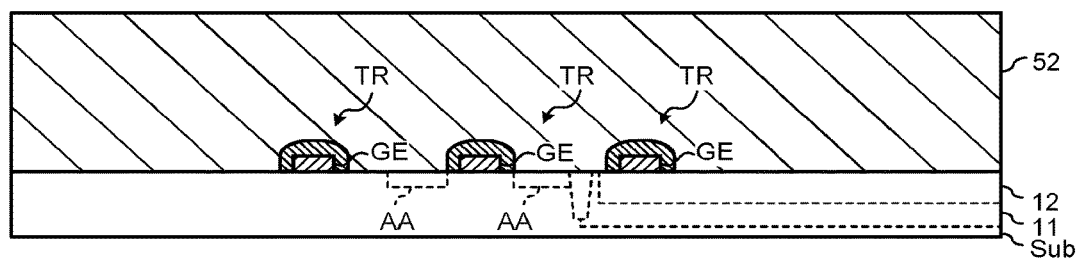
Figure 4C:
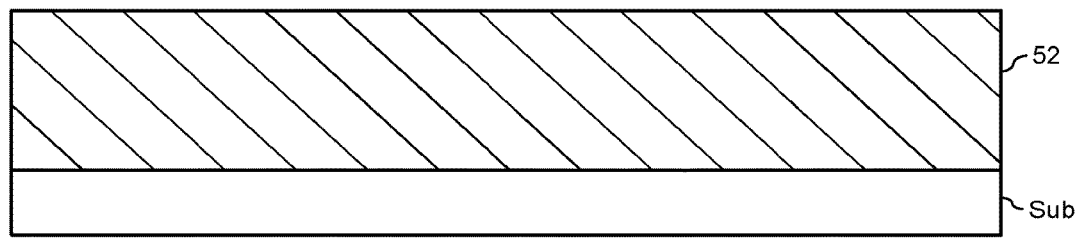

As illustrated in FIGS. 4B and 4C, the stacked body LMas is completely removed from the substrate Sub in a region where the peripheral circuits PER are formed and in a region where the misalignment mark MK is formed. The entire of the region where the peripheral circuits PER are formed is covered by the insulating layer 52 up to the height of the bonding layer Bi on the stacked body LMas. The entire of the region where misalignment mark MK is formed is covered by the insulating layer 52 up to the height of the bonding layer Bi on the stacked body LMas.

Note that, although not illustrated in FIGS. 4A to 4C, with this timing, a stepwise structure is formed at the ends of the stacked body LMas of FIG. 4A that has not been removed.

Figure 5A:
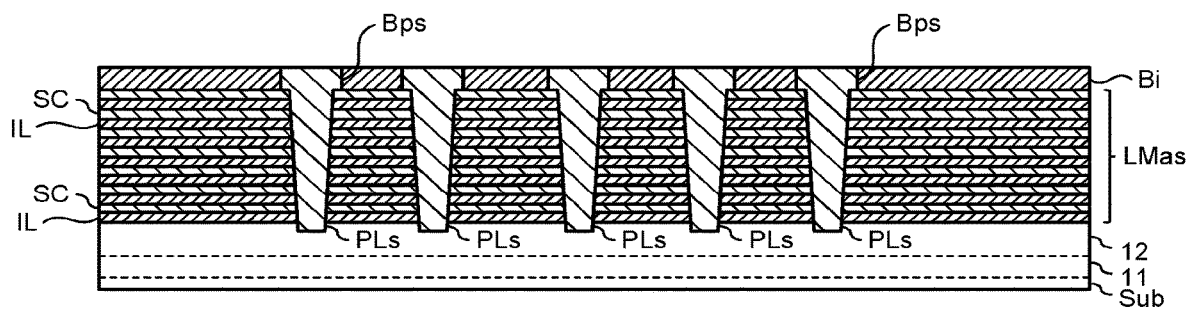
FIGS. 5A to 5C are cross-sectional views illustrating an example of the procedure in the method for manufacturing the semiconductor memory device according to the first embodiment.

As illustrated in FIG. 5A, pillars PLs, each of which is obtained by filling a sacrificial layer into the underlying structure of the pillar PL, are formed in the stacked body LMas. That is, memory holes are formed such that the memory holes penetrate the stacked body LMas and the bonding layer Bi and such that the diameter of the memory holes is expanded within the bonding layer Bi. A sacrificial layer such as an amorphous silicon layer is filled inside each of the memory holes. Thus, the pillars PLs, which have the bonding portion Bps at their upper end, are formed.

Figure 5B:
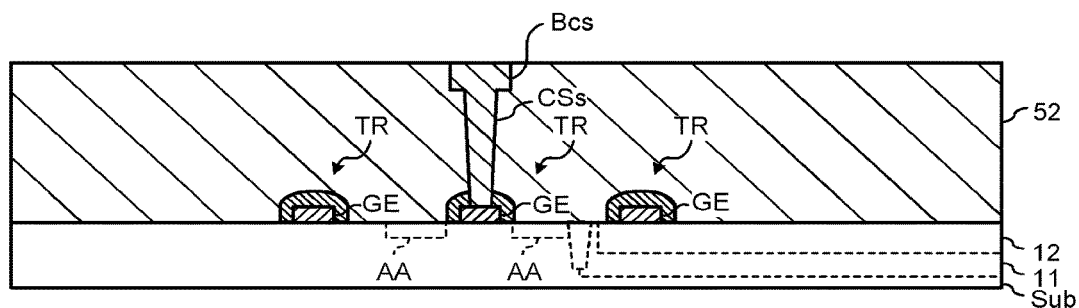

As illustrated in FIG. 5B, a contact CSs and a bonding portion Bcs, which are obtained by filling a sacrificial layer into the underlying structure of the contact CS, are formed on the gate electrode GE of the transistor TR. That is, a contact hole is formed such that the contact hole penetrates the insulating layer 52 above the transistor TR as far as the top surface of the gate electrode GE and such that the contact hole has an expanded diameter at the upper end. A sacrificial layer such as an amorphous silicon layer is filled inside the contact hole. The sacrificial layer, which is an amorphous silicon layer or the like, is a layer for formation of the contact CS and the bonding portion Bc once replaced subsequently with a conductive material.

Figure 5C:
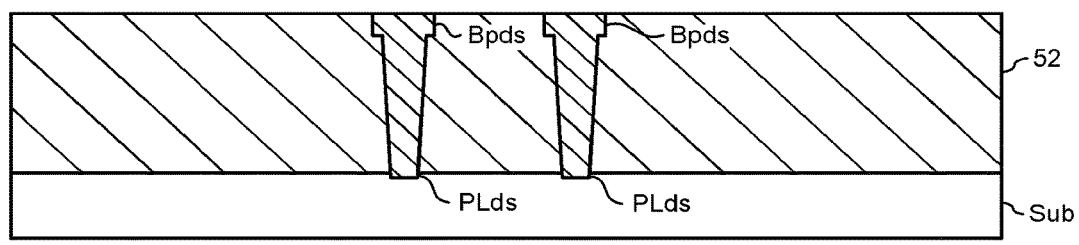

As illustrated in FIG. 5C, dummy pillars PLds, each of which is obtained by filling the sacrificial layer into the underlying structure of the dummy pillar PLds, are formed. That is, dummy holes that penetrate the insulating layer 52 and have an expanded diameter at the upper end are formed, and a sacrificial layer such as an amorphous silicon layer is filled inside the dummy holes. Thus, the dummy pillars PLds having a bonding portion Bpds at their upper end are formed.

Figure 6A:
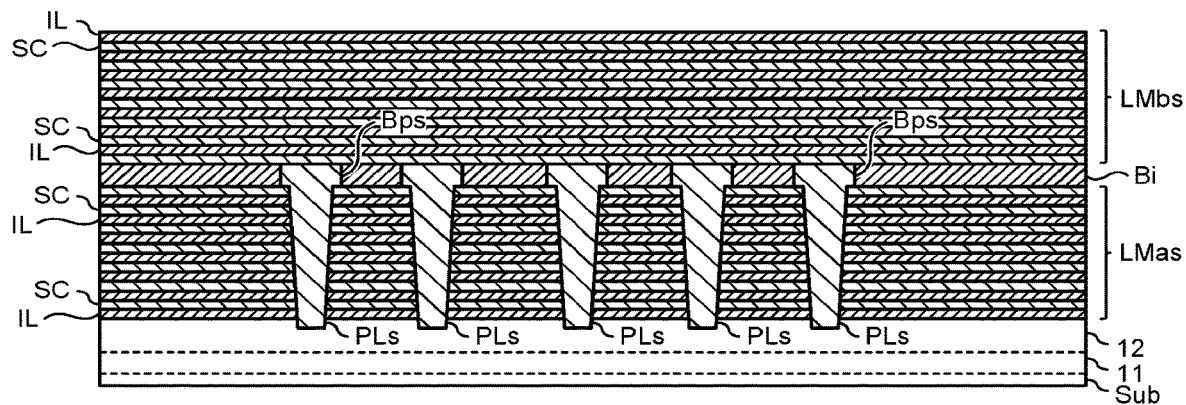
FIGS. 6A to 6C are cross-sectional views illustrating an example of the procedure in the method for manufacturing the semiconductor memory device according to the first embodiment.
Figure 6B:
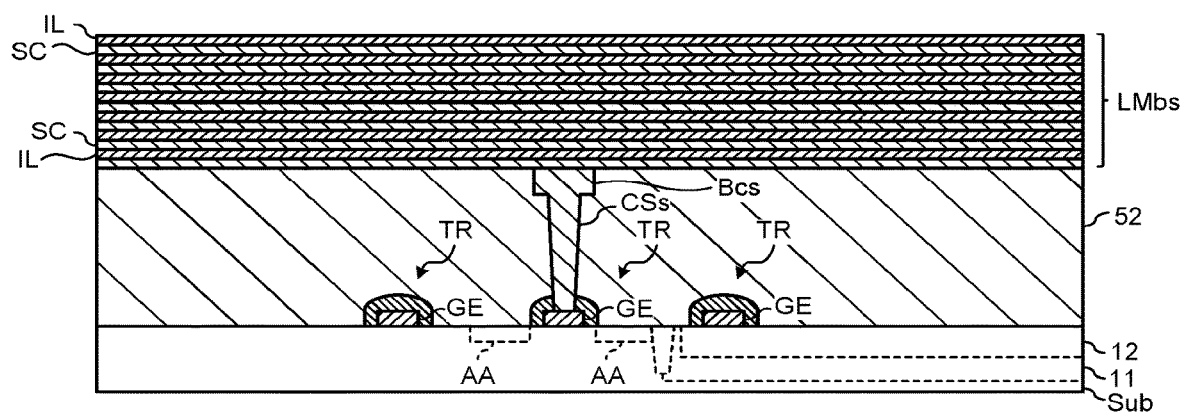
Figure 6C:
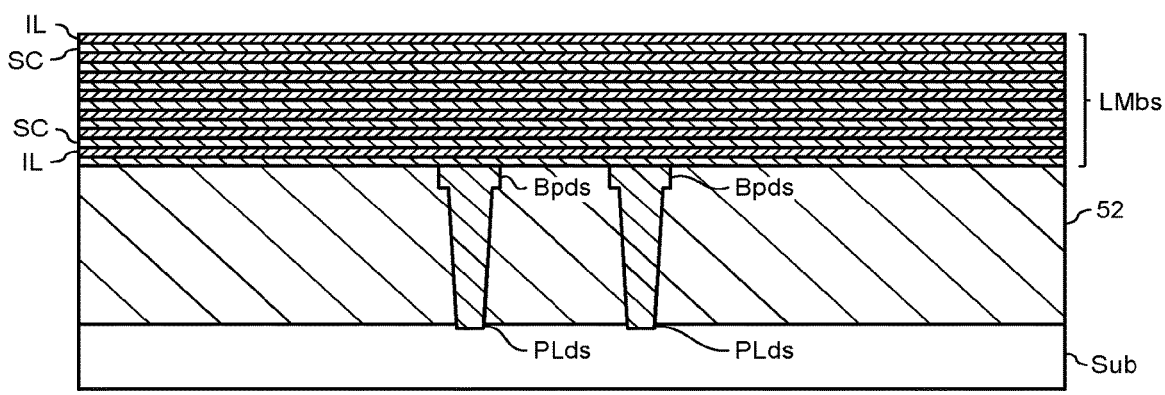

As illustrated in FIGS. 6A to 6C, a stacked body LMbs, in which sacrificial layers SC and insulating layers IL are alternately stacked in multiple layers, is formed on top of the respective portions. That is, in the part illustrated in FIG. 6A, the stacked body LMbs is formed, via the bonding layer Bi, on the stacked body LMas. In the parts illustrated in FIGS. 6B and 6C, the stacked body LMbs is formed on the insulating layer 52.

Figure 7A:
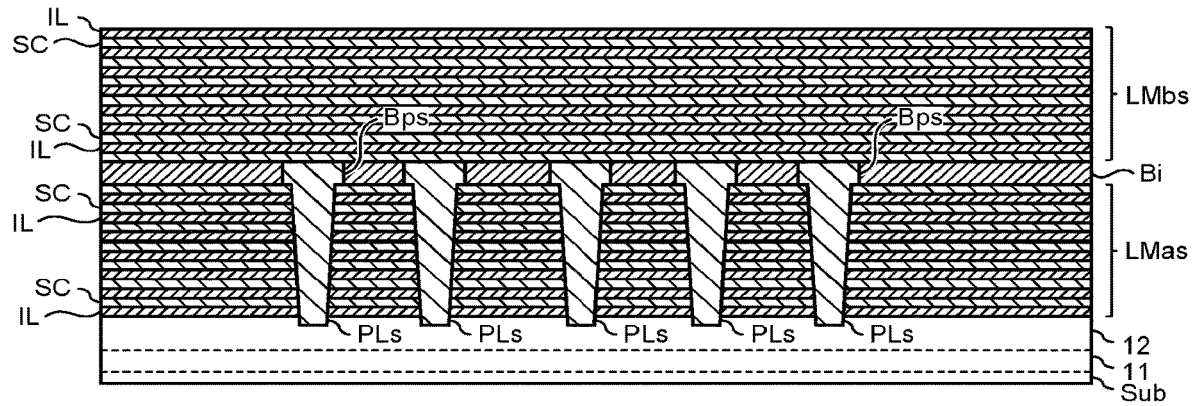
FIGS. 7A to 7C are cross-sectional views illustrating an example of the procedure in the method for manufacturing the semiconductor memory device according to the first embodiment.
Figure 7B:
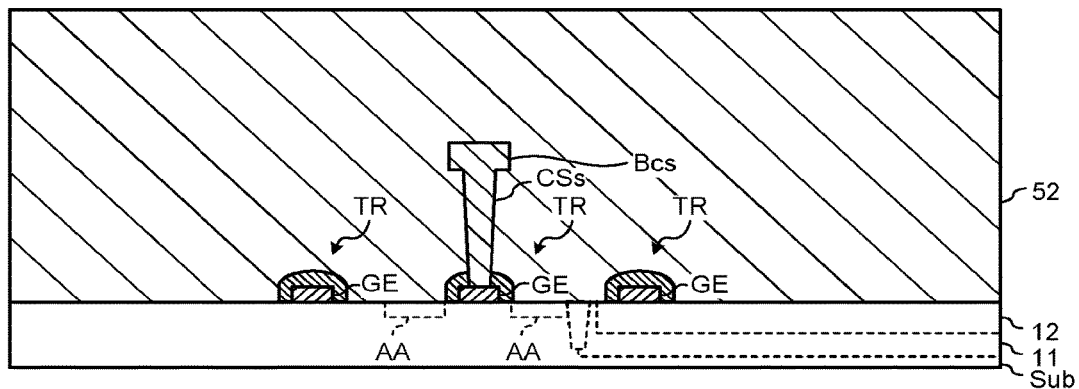

As illustrated in FIG. 7B, after the stacked body LMbs has been completely removed from the insulating layer 52 in the region where the peripheral circuits PER are formed, the configuration is backfilled by the insulating layer 52. Thus, the entire transistor TR is covered by the insulating layer 52 up to a height substantially equal to the uppermost layer of the stacked body LMbs.

Figure 7C:
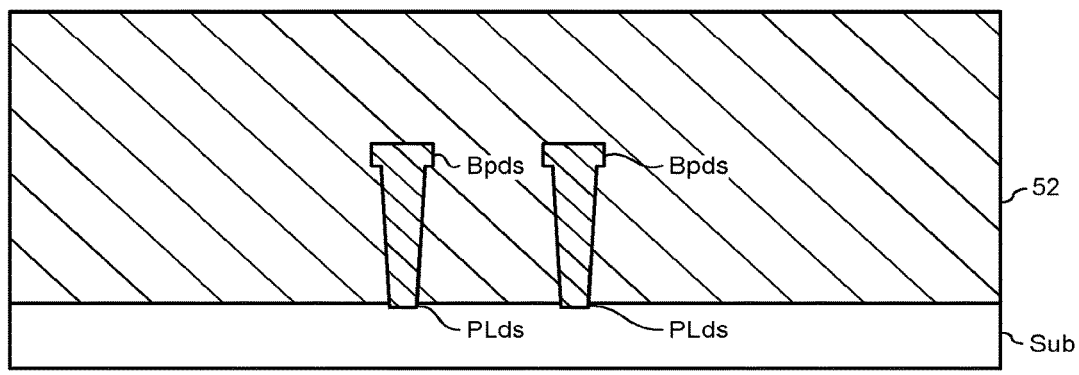

As illustrated in FIG. 7C, after the stacked body LMbs has been completely removed from the insulating layer 52 in the region where the misalignment mark MK is formed, the configuration is backfilled by the insulating layer 52. Thus, the dummy pillars PLds are covered by the insulating layer 52 up to a height substantially equal to the uppermost layer of the stacked body LMbs.

Note that, although not illustrated in FIGS. 7A to 7C, with this timing, a stepwise structure is formed at the ends of the stacked body LMbs of FIG. 7A that has not been removed.

Figure 8A:
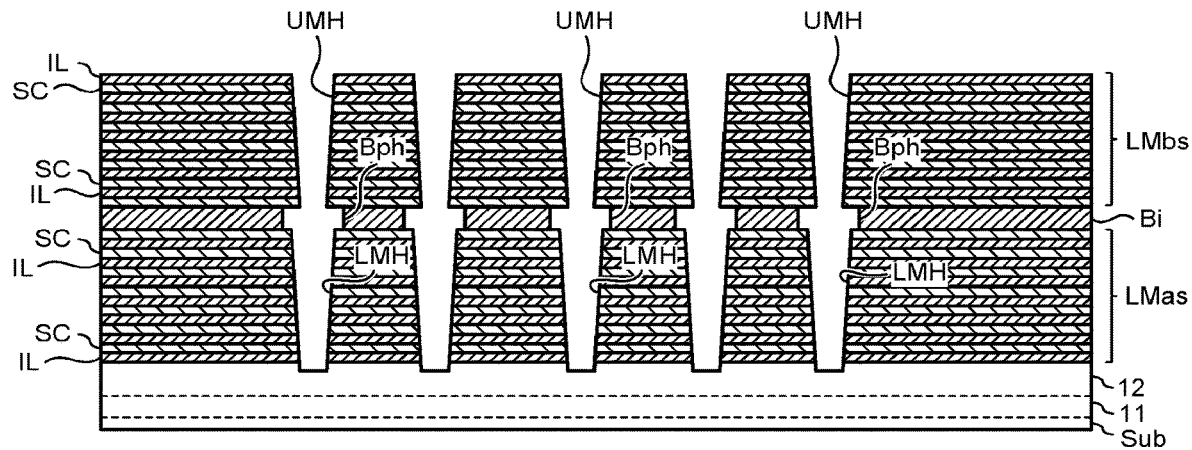
FIGS. 8A to 8C are cross-sectional views illustrating an example of the procedure in the method for manufacturing the semiconductor memory device according to the first embodiment.
Figure 8B:
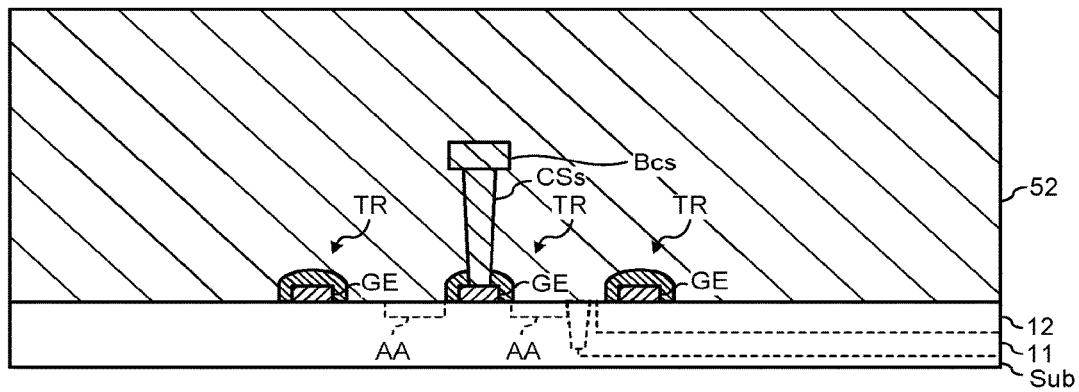

As illustrated in FIG. 8A, memory holes UMH that penetrate the stacked body LMbs are formed so as to contact the bonding portions Bps of the pillars PLs. In addition, the sacrificial layer is removed, via the memory holes UMH, from the bonding portions Bps and the pillars PLs in the lower-layer. Thus, lower memory holes LMH that penetrate the stacked body LMas are connected, via bonding portions Bph, to upper memory holes UMH.

Figure 8C:
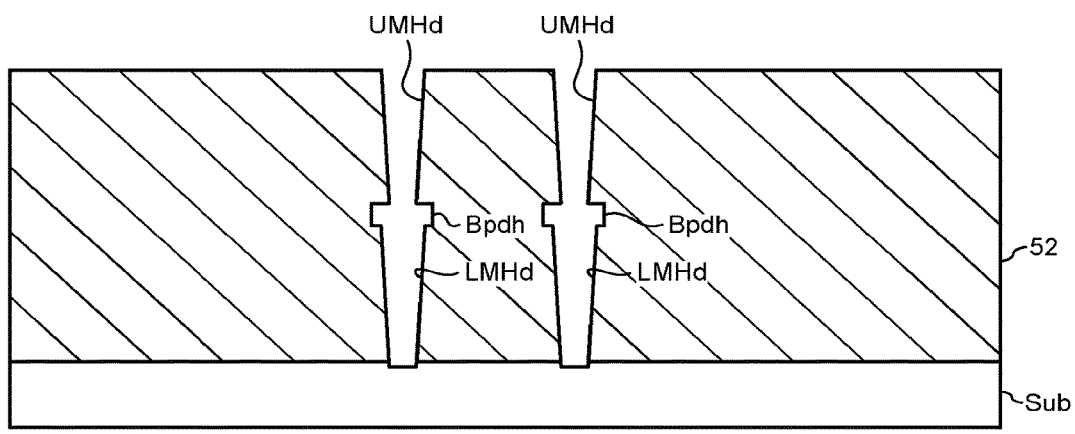

As illustrated in FIG. 8C, dummy holes UMHd, which extend from the upper end of the insulating layer 52 to the bonding portions Bpds of the dummy pillars PLds, are formed. Furthermore, the sacrificial layer is removed, via the dummy holes UMHd, from bonding portions Bpds and the dummy pillars PLds in the lower-layer. Thus, the upper and lower dummy holes UMHd and LMHd that penetrate the insulating layer 52 are connected to each other via bonding portions Bpdh.

Figure 9A:
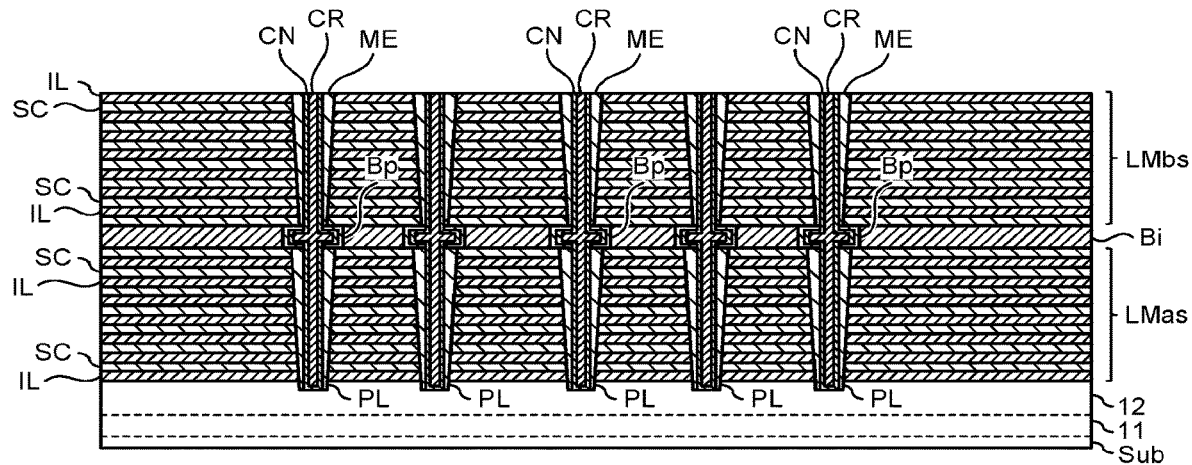
FIGS. 9A to 9C are cross-sectional views illustrating an example of the procedure in the method for manufacturing the semiconductor memory device according to the first embodiment.
Figure 9B:
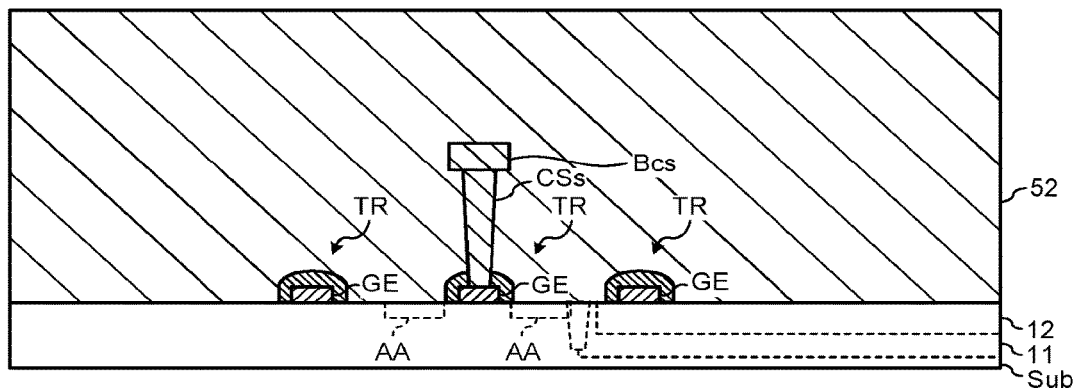

As illustrated in FIG. 9A, the pillars PL are formed in the stacked bodies LMas and LMbs. That is, the memory layer ME of an $SiO_2$ layer/SiN layer/$SiO_2$ layer, or the like, the channel layer CN of an amorphous silicon layer or a polysilicon layer, or the like, and the core layer CR of an $SiO_2$ layer, or the like, are formed in that order, starting from the sidewall of the memory holes LMH and UMH and the bonding portion Bph. The channel layer CN is also formed in the bottom part of the memory holes. Thus, the pillars PL each having the bonding portion Bp in the center section are formed.

Figure 9C:
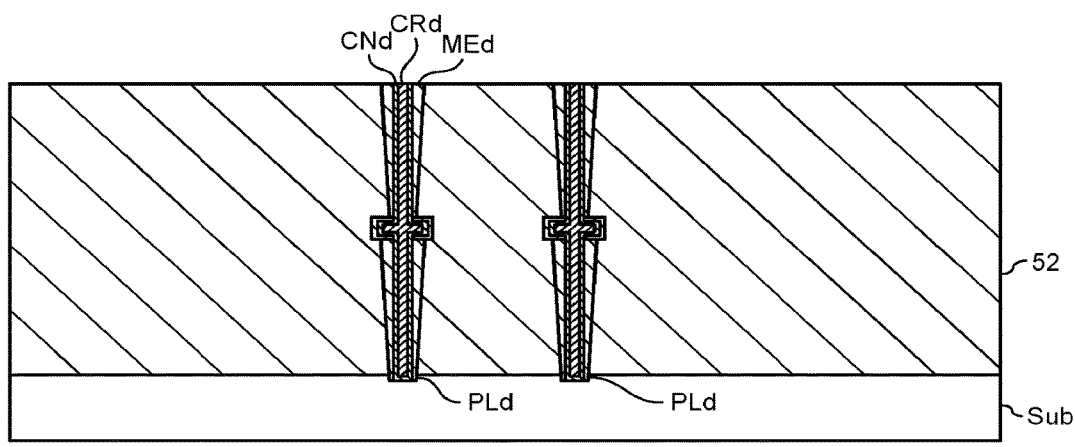

As illustrated in FIG. 9C, the dummy pillars PLd are formed in the insulating layer 52. That is, the dummy layer MEd of an $SiO_2$ layer/SiN layer/$SiO_2$ layer, or the like, the dummy layer CNd of an amorphous silicon layer or a polysilicon layer, or the like, and the dummy layer CRd of an $SiO_2$ layer, or the like, are formed in that order, starting from the sidewall of the dummy holes LMHd and UMHd and the bonding portion Bpdh. The dummy layer CNd is also formed on the bottom surface of the dummy holes LMHd. Both the dummy layers MEd and CNd may also be formed on the bottom surface of the dummy holes LMHd. Thus, the dummy pillars PLd which have a bonding portion Bpd in their center section are formed.

Figure 10A:
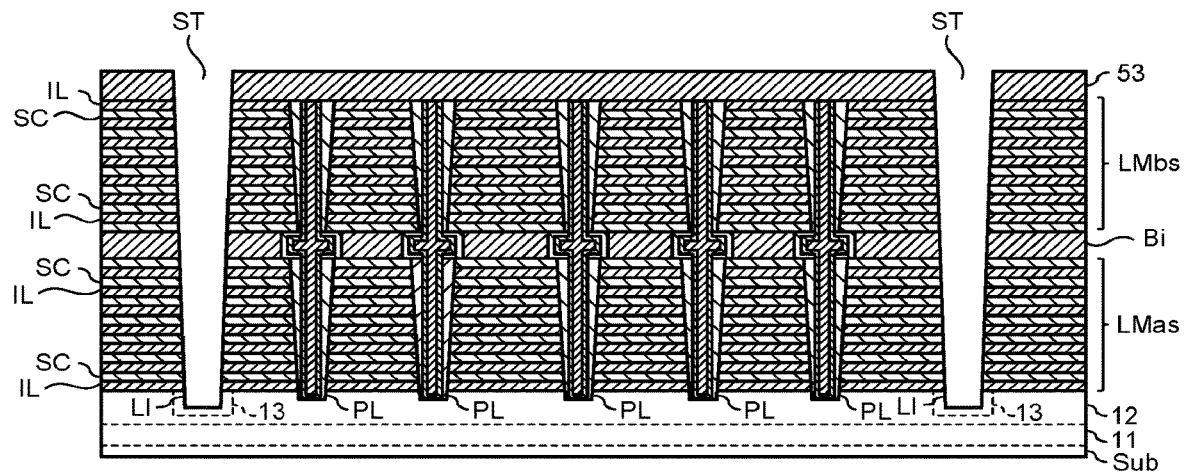
FIGS. 10A to 10C are cross-sectional views illustrating an example of the procedure in the method for manufacturing the semiconductor memory device according to the first embodiment.
Figure 10B:
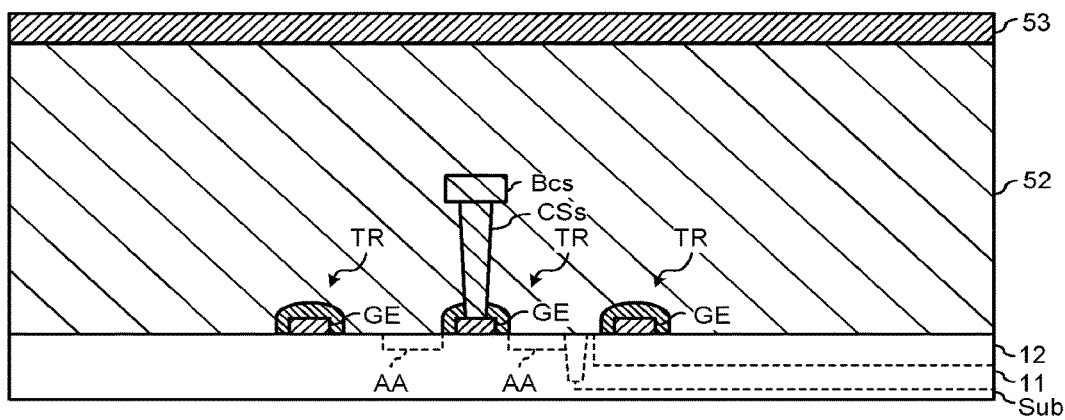
Figure 10C:
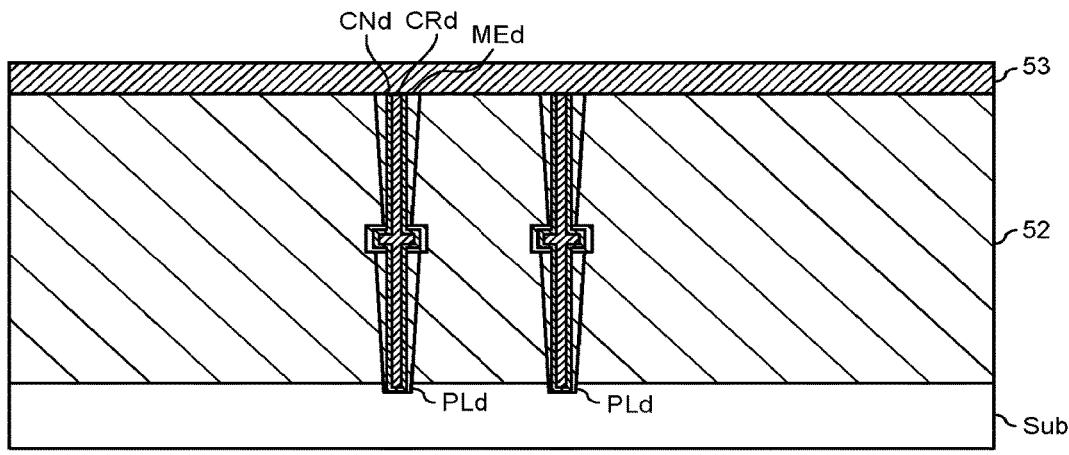

As illustrated in FIGS. 10A to 10C, the insulating layer 53 is formed on top of the respective portions. That is, in the part illustrated in FIG. 10A, the insulating layer 53 is formed on the stacked body LMbs. In the parts illustrated in FIGS. 10B and 10C, the insulating layer 53 is formed on the insulating layer 52.

As illustrated in 10A, slits ST, which penetrate the insulating layer 53, the stacked body LMbs, the bonding layer Bi, and the stacked body LMas and reach the surface of the substrate Sub, are formed. Further, the $n^+$ diffusion regions 13 are formed in the surface layer portions of the substrate Sub through the slit STs penetrating through the stacked bodies LMbs, LMas or the like.

As illustrated in 11A, the sacrificial layer SC in the stacked bodies LMas and LMbs is removed via the slits ST penetrating the stacked bodies LMas and LMbs. Thus, stacked bodies LMag and LMbg, in which gaps are formed between each of the insulating layers IL, are formed.

As illustrated in 12A, a conductive material is filled into the gaps in the stacked bodies LMag and LMbg via the slits ST penetrating the stacked bodies LMag and LMbg. Thus, the stacked bodies LMa and LMb, in which the word lines WL are formed between each of the insulating layers IL, are formed.

Figure 11A:
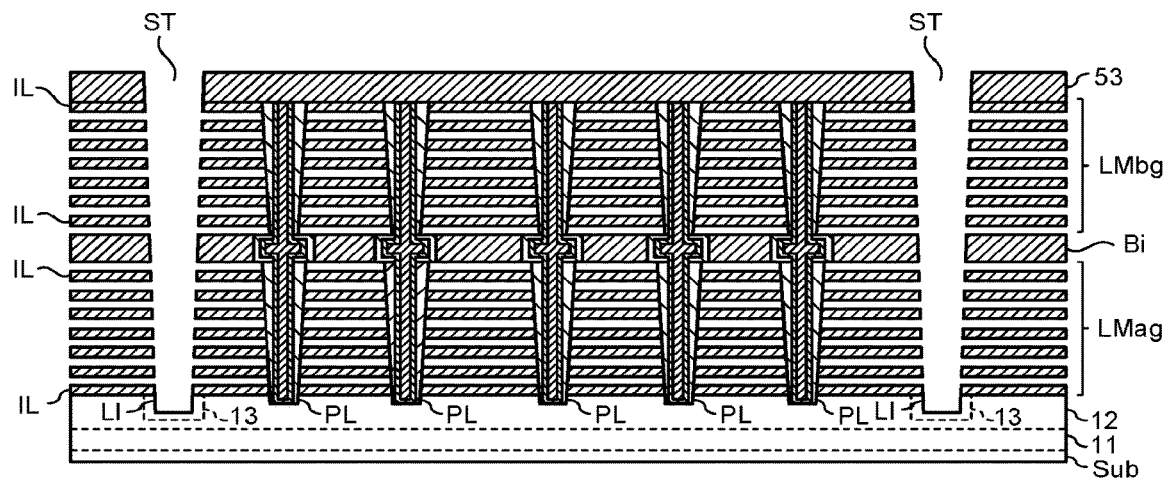
FIGS. 11A to 11C are cross-sectional views illustrating an example of the procedure in the method for manufacturing the semiconductor memory device according to the first embodiment.
Figure 11B:
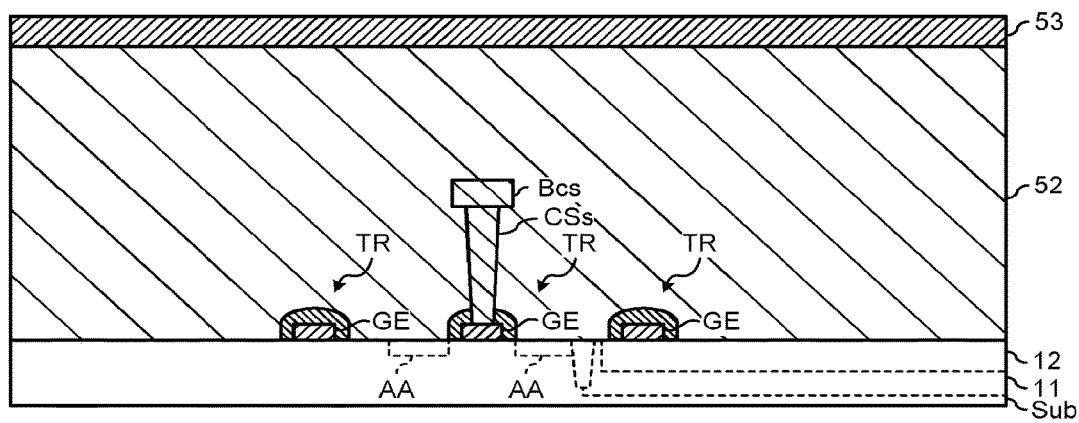
Figure 11C:
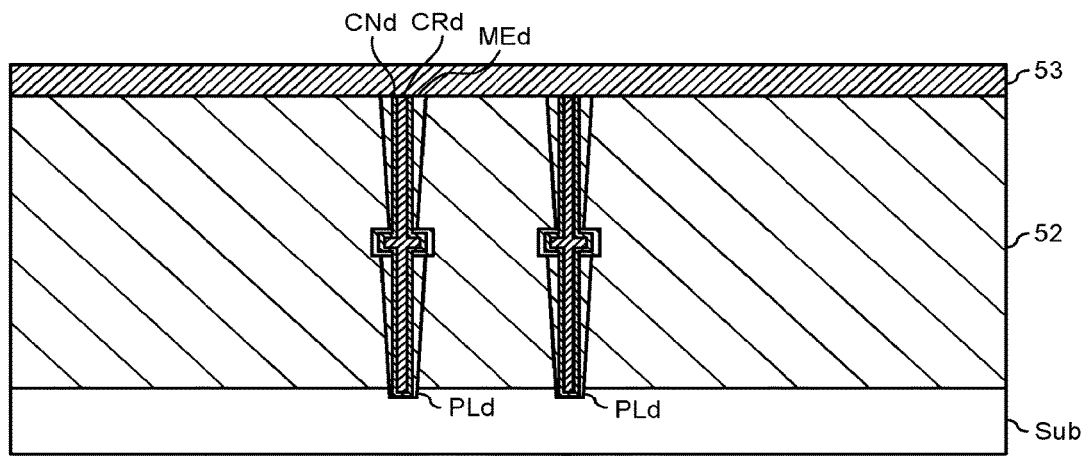
Figure 12A:
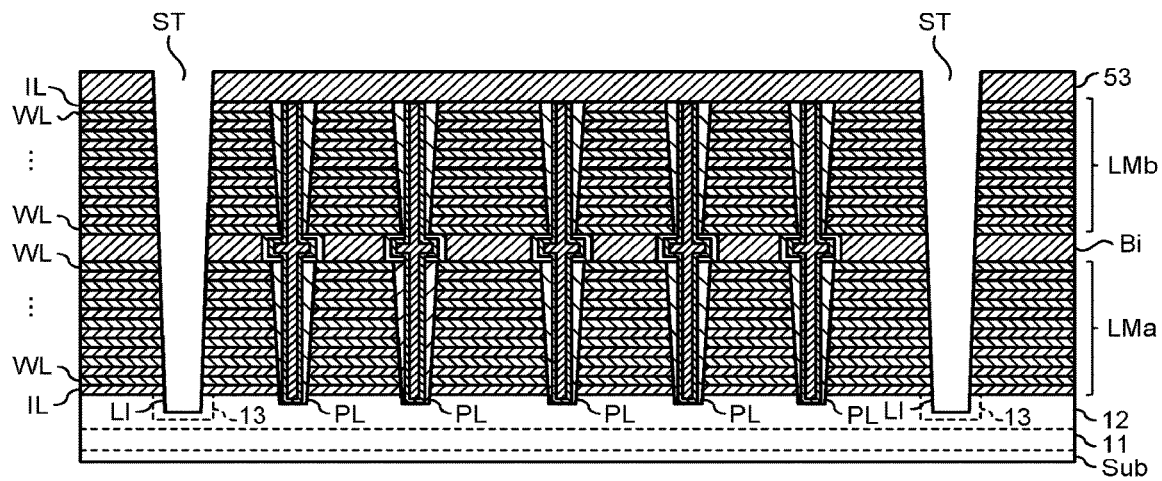
FIGS. 12A to 12C are cross-sectional views illustrating an example of the procedure in the method for manufacturing the semiconductor memory device according to the first embodiment.
Figure 12B:
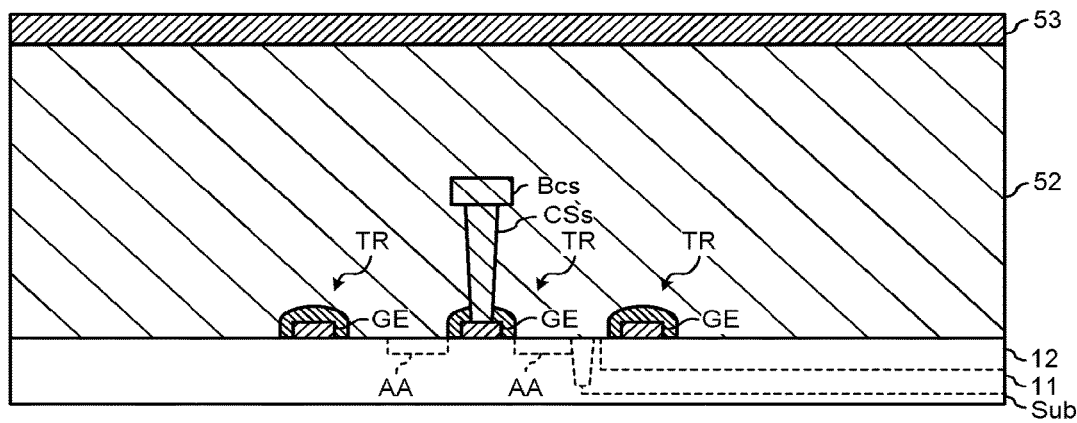
Figure 12C:
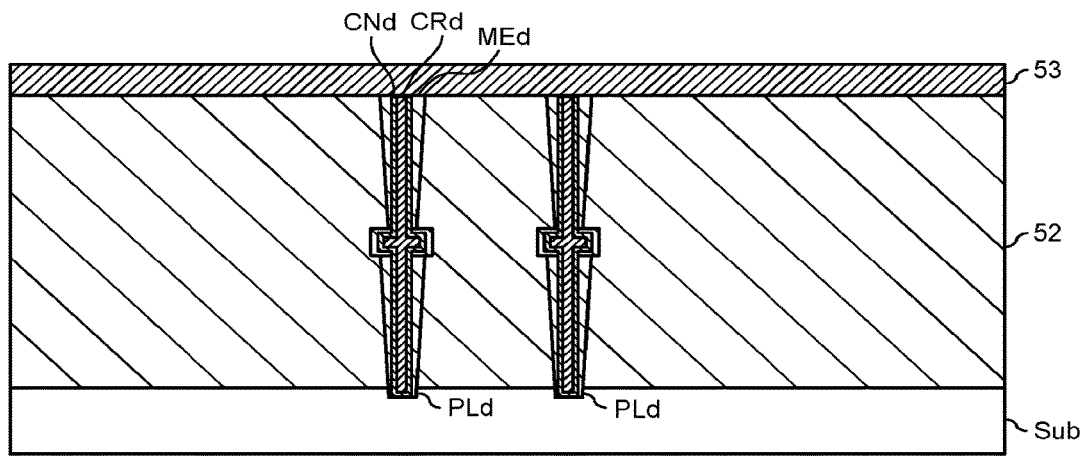

As illustrated in FIGS. 11A and 12A, the processing to replace the sacrificial layers SC with the word lines WL is sometimes referred to as replacement.

Figure 13A:
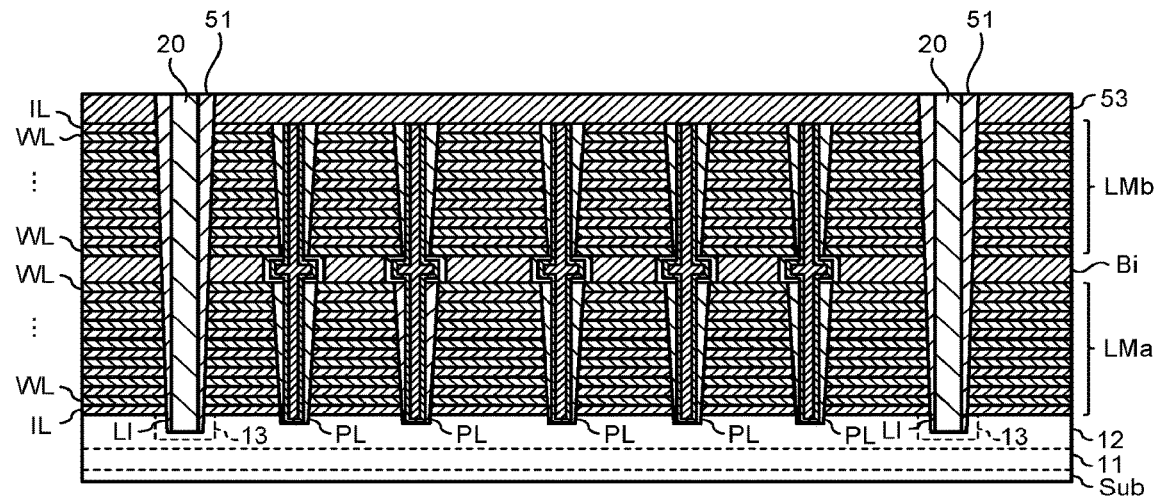
FIGS. 13A to 13C are cross-sectional views illustrating an example of the procedure in the method for manufacturing the semiconductor memory device according to the first embodiment.
Figure 13B:
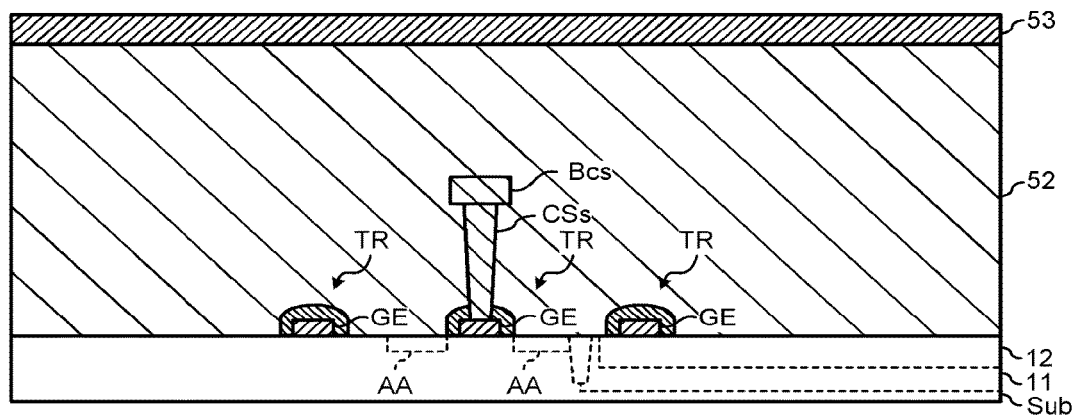
Figure 13C:
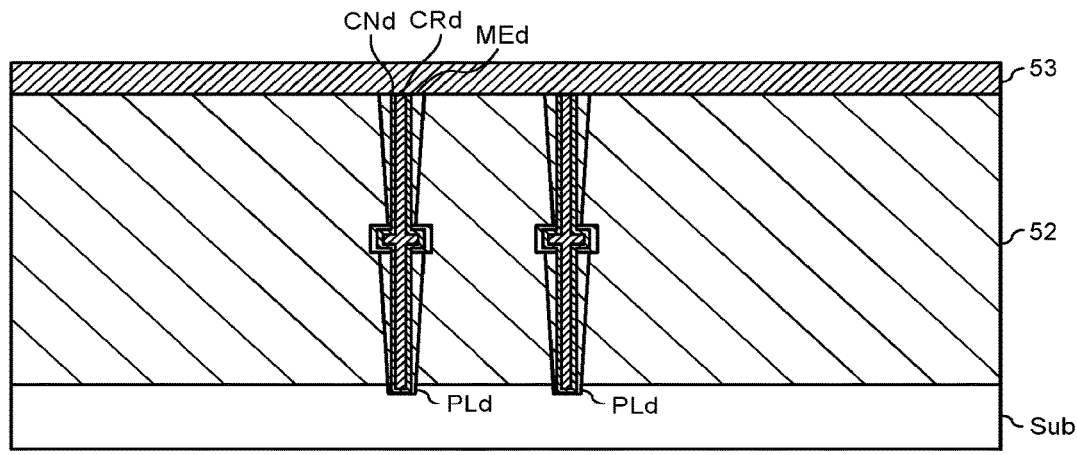

As illustrated in FIG. 13A, the insulating layer 51 is formed on the sidewall of the slits ST. The conductive layer 20 is filled on the inside of the insulating layer 51. Thus, the contacts LI connected to the $n^+$ diffusion regions 13 are formed.

Figure 14A:
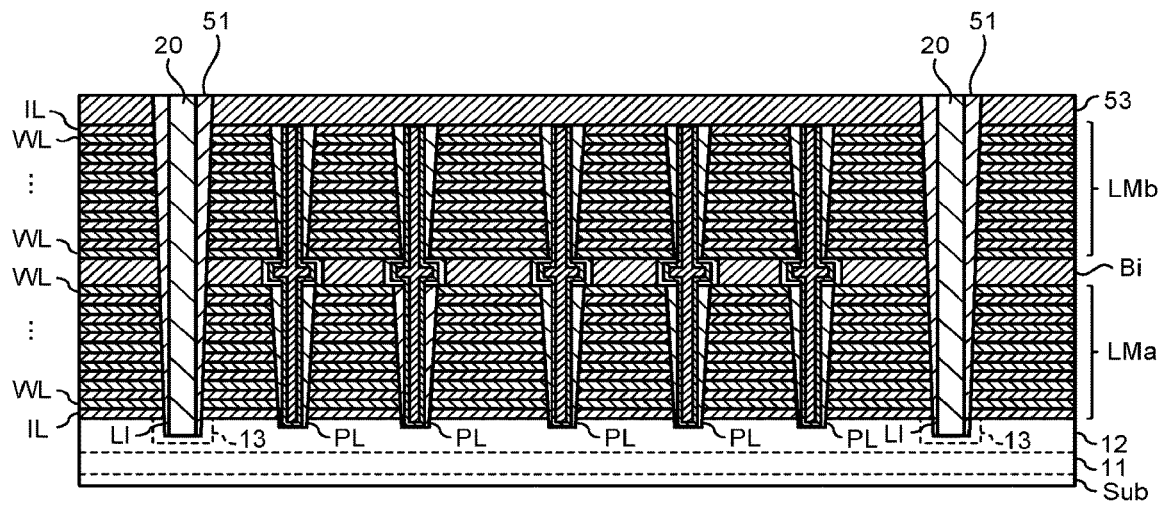
FIGS. 14A to 14C are cross-sectional views illustrating an example of the procedure in the method for manufacturing the semiconductor memory device according to the first embodiment.
Figure 14B:
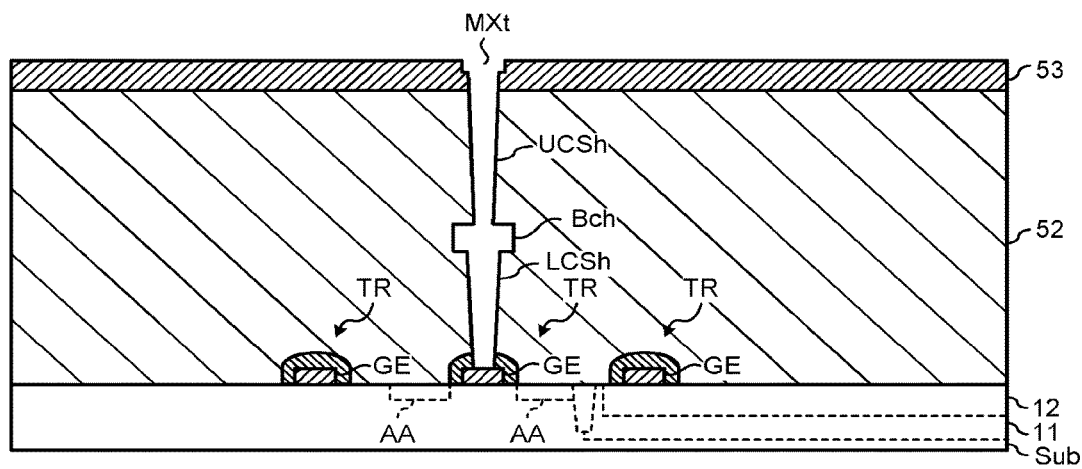

As illustrated in FIG. 14B, a contact hole UCSh, which extends from the upper end of the insulating layer 52 to the bonding portion Bcs of the contact CSs, is formed. Furthermore, the sacrificial layer is removed from the lower bonding portion Bcs and the contact CSs via the contact hole UCSh. Thus, the upper and lower contact holes UCSh and LCSh that penetrate the insulating layer 52 are connected to each other via the bonding portion Bch.

In addition, a groove MXt for the wiring layer MX, which is connected to the contact hole UCSh, is formed in the surface layer portion of the insulating layer 53.

Figure 14C:
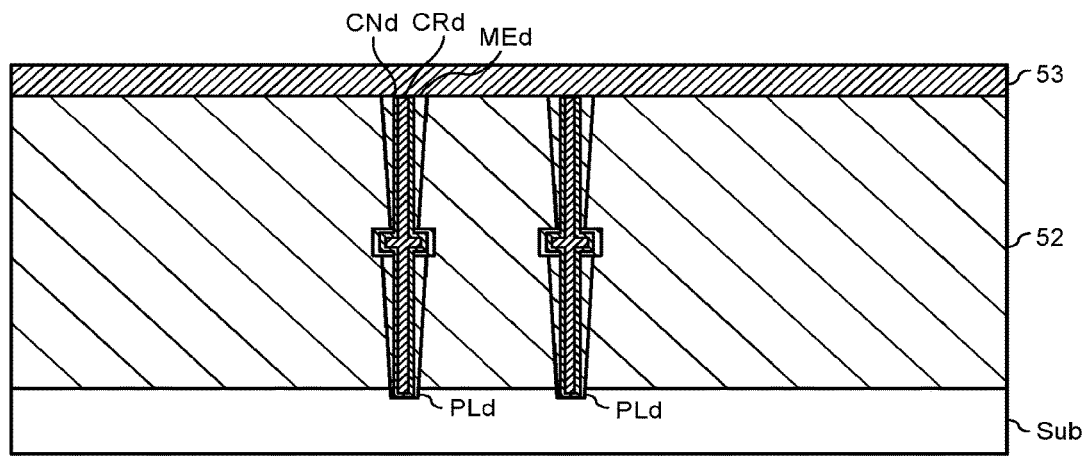

Note that, although not illustrated in FIGS. 14A to 14C, with this timing, contact holes connected to the word lines WL are formed in each step of the stepwise structure of the end portions of the stacked bodies LMa and LMb in FIG. 14A. The aforementioned groove MXt is also connected to these contact holes.

Figure 15A:
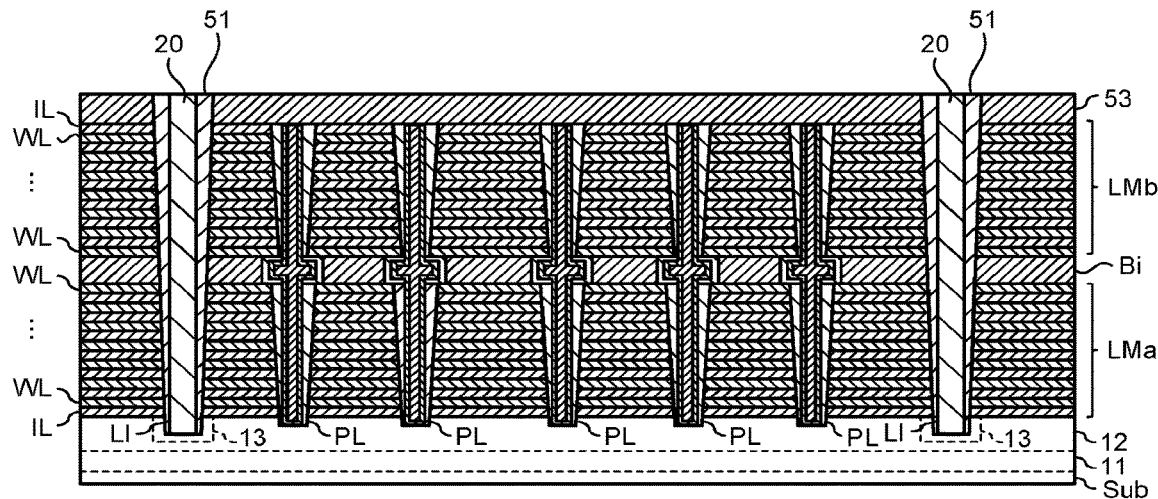
FIGS. 15A to 15C are cross-sectional views illustrating an example of the procedure in the method for manufacturing the semiconductor memory device according to the first embodiment.
Figure 15B:
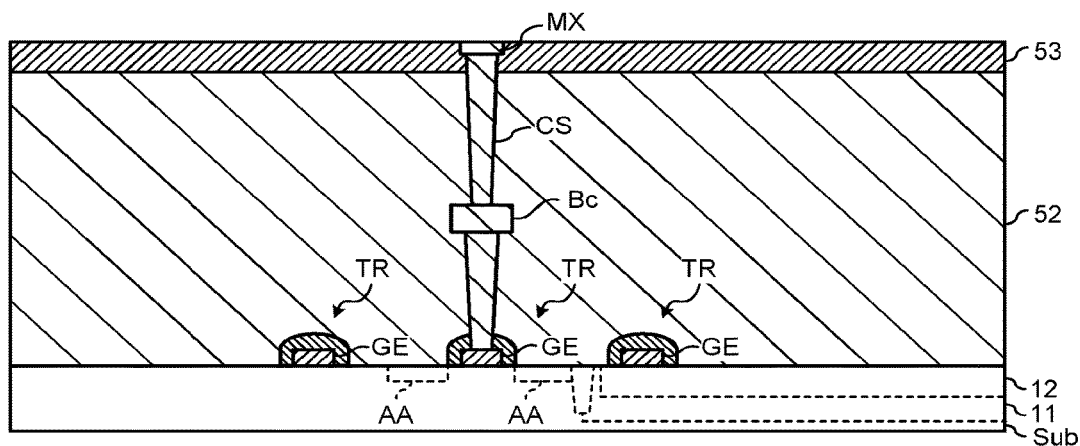
Figure 15C:
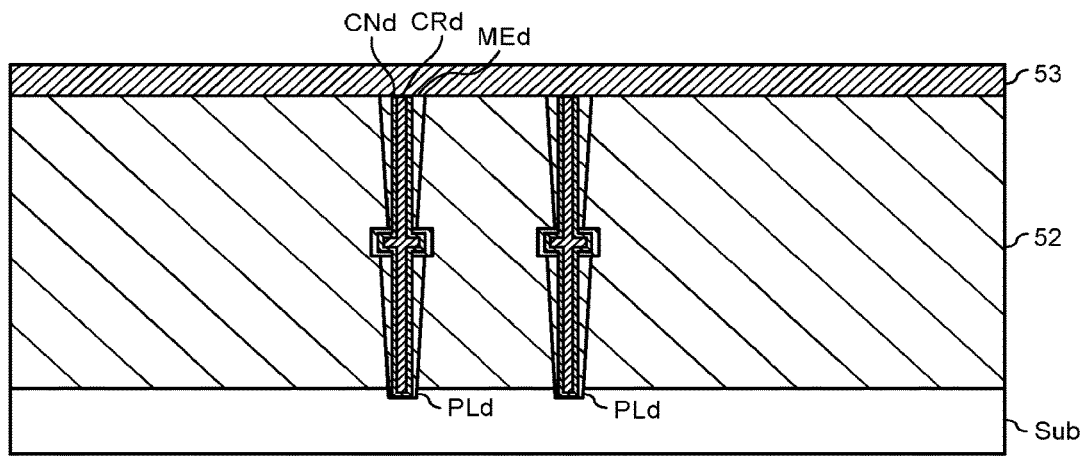

As illustrated in FIG. 15B, conductive material is filled into the contact holes UCSh and LCSh, the bonding portion Bch, and the groove MXt, thereby forming the contact CS with the bonding portion Bc, and the wiring layer MX connected to the contact CS.

The method, in FIGS. 14A to 15C, for batch formation of the contacts CS and the wiring layer MX connected to the contacts CS as described hereinabove is sometimes referred to as the dual damascene technique.

Figure 16A:
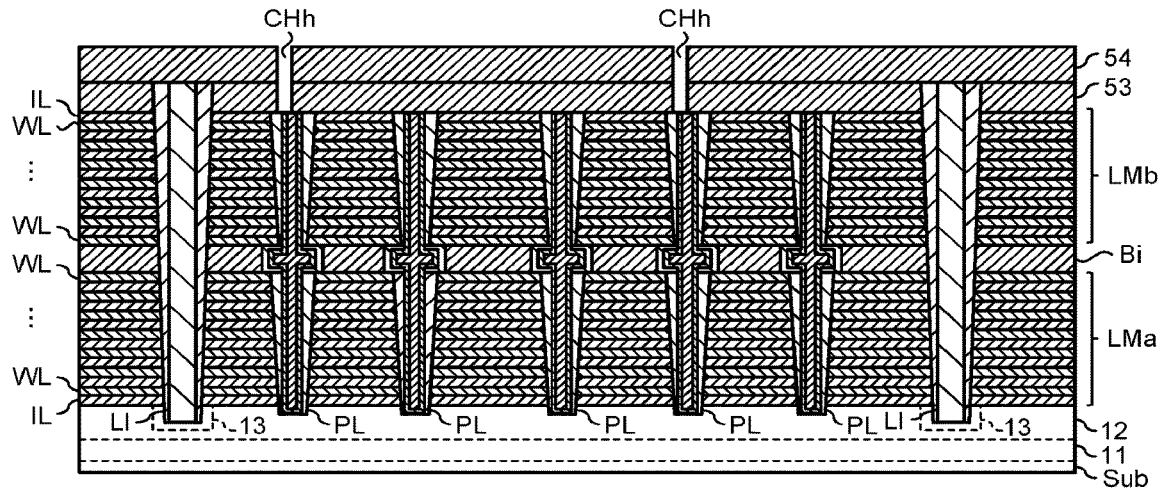
FIGS. 16A to 16C are cross-sectional views illustrating an example of the procedure in the method for manufacturing the semiconductor memory device according to the first embodiment.
Figure 16B:
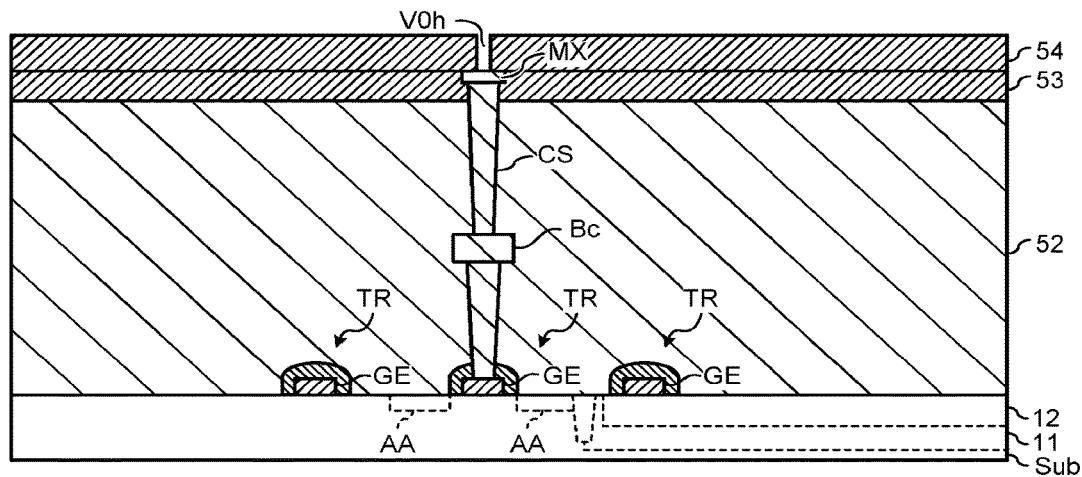
Figure 16C:
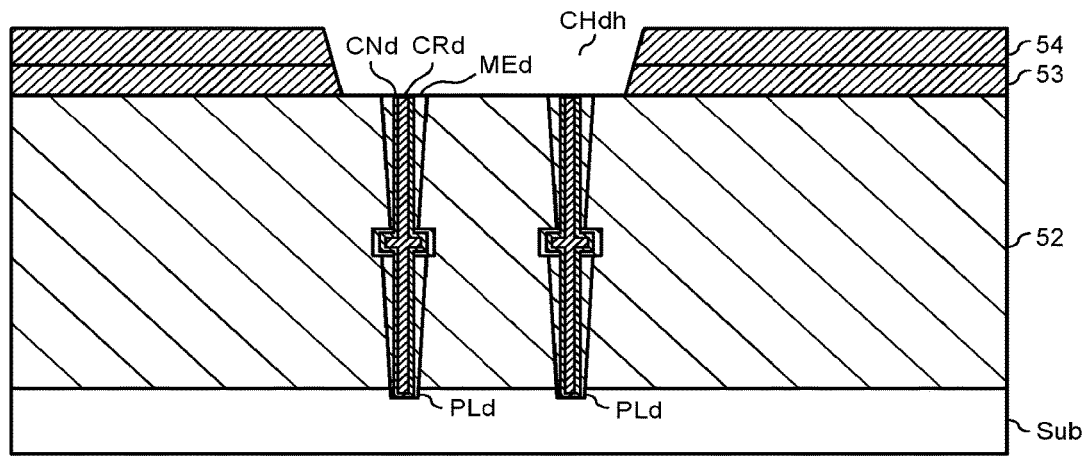

As illustrated in FIGS. 16A to 16C, the insulating layer 54 is formed on the insulating layer 53.

As illustrated in FIG. 16A, holes CHh, which penetrate the insulating layers 53 and 54 and are connected to the channel layer CN of the pillars PL, are formed. A hole (not illustrated), which penetrates the insulating layer 54 and is connected to the contact LI, is formed.

As illustrated in FIG. 16B, the hole V0*h*, which penetrates the insulating layer 54 and is connected to the wiring layer MX, is formed.

As illustrated in FIG. 16C, a dummy hole CHdh, which penetrates the insulating layers 53 and 54 and opens onto a plurality of dummy pillars PLd, is formed.

Figure 17A:
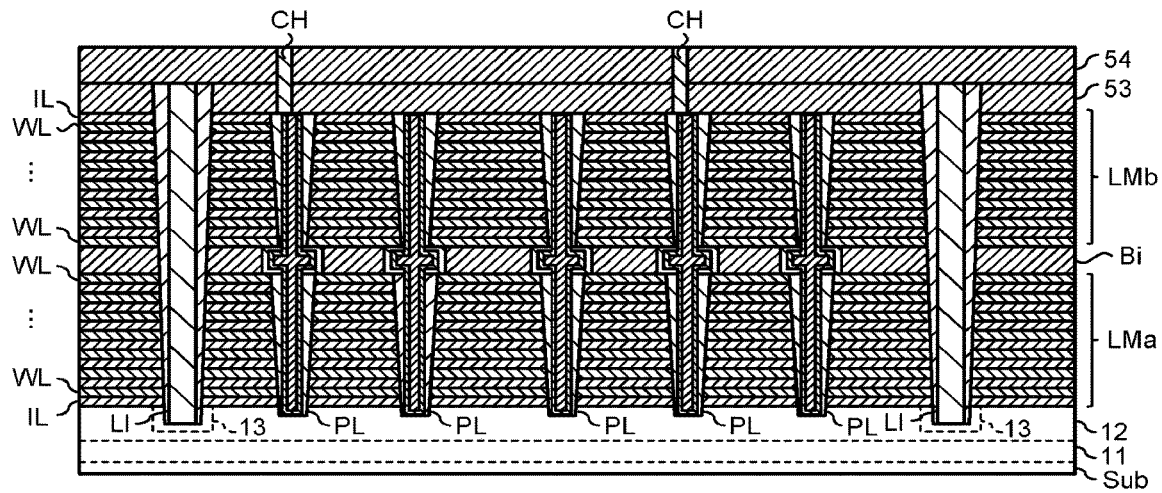
FIGS. 17A to 17C are cross-sectional views illustrating an example of the procedure in the method for manufacturing the semiconductor memory device according to the first embodiment.

As illustrated in FIG. 17A, the holes CHh are filled with conductive material, thereby forming the plugs CH which are connected to the channel layer CN of the pillars PL. The hole is filled with conductive material, thereby forming the plug which is connected to the contact LI.

Figure 17B:
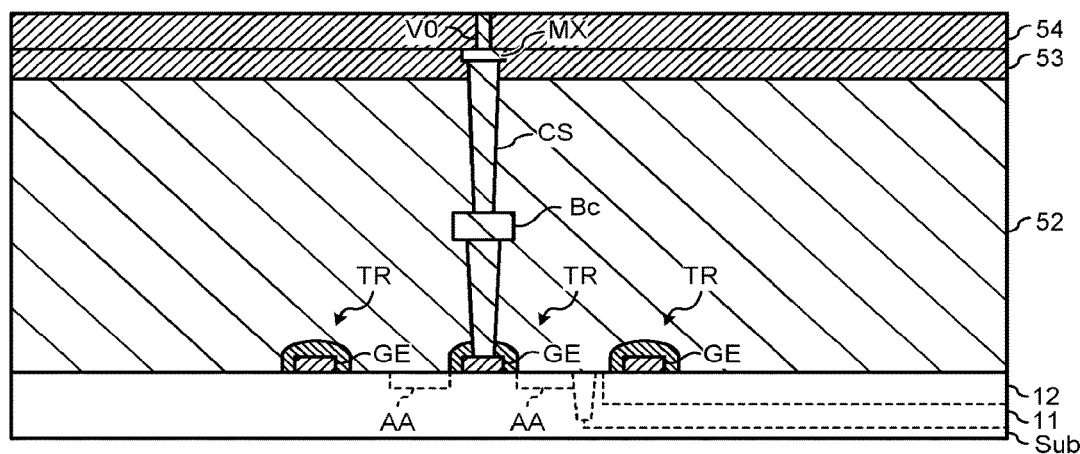

As illustrated in FIG. 17B, the hole V0*h* is filled with conductive material, thereby forming the plug V0 which is connected to the contact CS via the wiring layer MX.

Figure 17C:
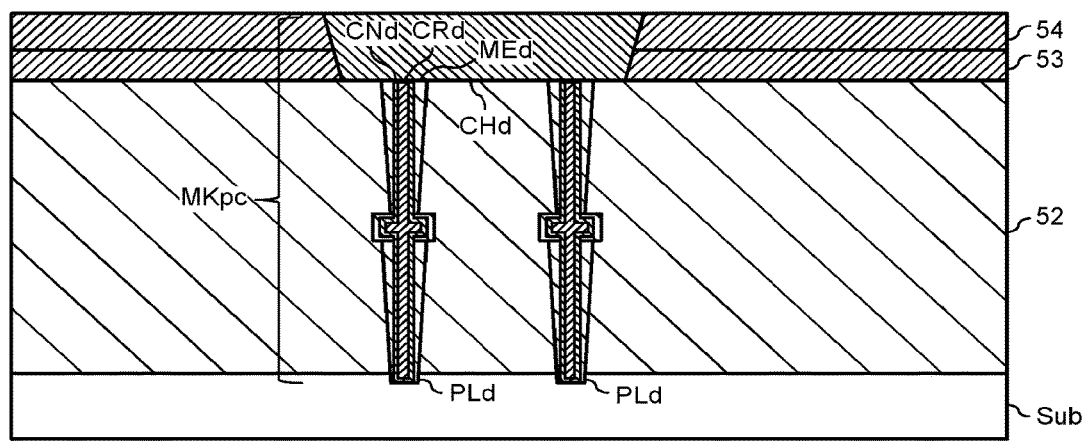

As illustrated in FIG. 17C, the dummy hole CHdh is filled with conductive material, thereby forming the dummy plug CHd that covers the plurality of dummy pillars PLd. However, the dummy hole CHdh may also be filled with insulating material to form the dummy plug CHd.

Thereafter, upper-level wiring such as bit lines is formed on top of the plugs CH and V0, and the like except the dummy plug CHd in FIG. 17C.

The semiconductor memory device 1 according to the first embodiment is manufactured as described hereinabove.

Incidentally, misalignment inspection is performed by using the misalignment mark MK in the process of forming the holes CHh above the pillars PL in FIG. 16A.

FIGS. 18A to 18D are schematic diagrams illustrating aspects of misalignment inspection using the misalignment mark MK according to the first embodiment.

Figure 18A:
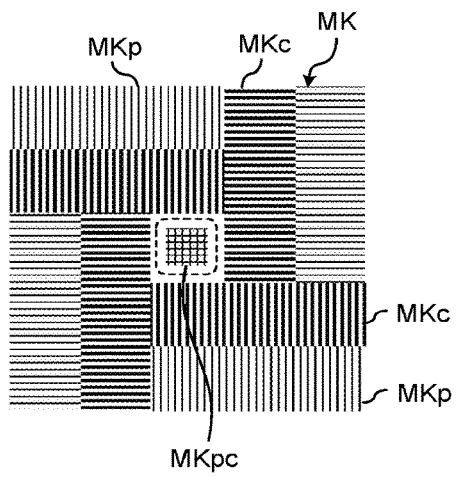
FIGS. 18A to 18D are schematic diagrams illustrating aspects of misalignment inspection using a misalignment mark according to the first embodiment.
Figure 18B:
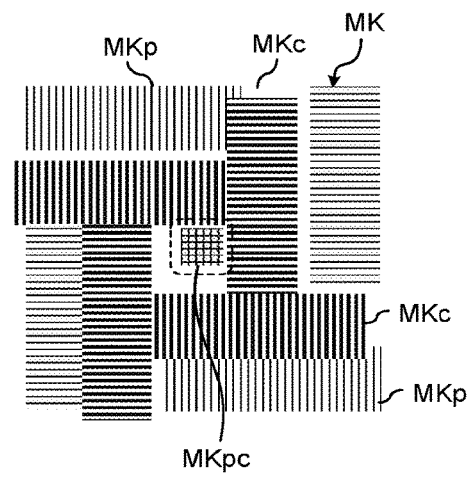

FIGS. 18A and 18B illustrate aspects when the misalignment mark MK is observed by optical technique with the usage of an optical microscope or the like after forming a mask pattern such as a resist pattern which is to serve as a mask when using a photolithography technique to form the holes CHh.

The mark MKp is configured from a grating pattern formed in the insulating layer 52 of the kerf region ARk in parallel with the formation of the pillars PL in the stacked bodies LMa and LMb. The mark MKc is configured from a mask pattern that is formed on the insulating layer 54.

Thus, in a state where the mask pattern has been formed, the mark MKp formed in the insulating layer 52 is in a state of being covered by the insulating layers 53 and 54 and a mask film, or the like. However, by using an optical technique, it is possible to see through the lower-layer configuration from the outermost surface layer. It is therefore possible to simultaneously observe the lower-layer mark MKp and outermost layer mark MKc.

FIG. 18A illustrates a state where the marks MKp and MKc have been correctly combined with each other and there is no misalignment. In this state, even for an actual pattern in chip region ARc, the hole regions of the mask pattern are assumed to be arranged so as to be superposed on the pillars PL.

FIG. 18B illustrates a state where the marks MKp and MKc have been combined in a displaced state and misalignment has occurred. In this state, even for an actual pattern in chip region ARc, there is a risk that the hole regions of the mask pattern will be formed out of alignment with the tops of the pillars PL.

In cases where displacement of the marks MKp and MKc is observed that are not limited to the example in FIG. 18B, a misaligned mask pattern is stripped, and the mask pattern is reformed to achieve the state in FIG. 18A. It is thus possible to suppress the formation of the holes CHh in a state where the mask pattern is displaced from the pillars PL.

Figure 18C:
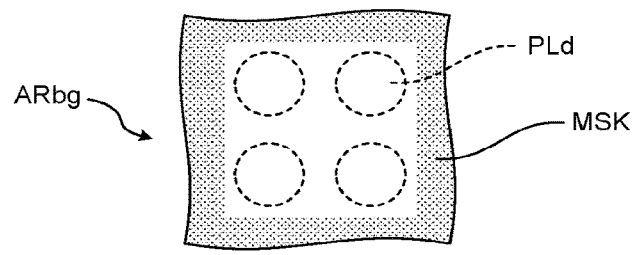
Figure 18D:
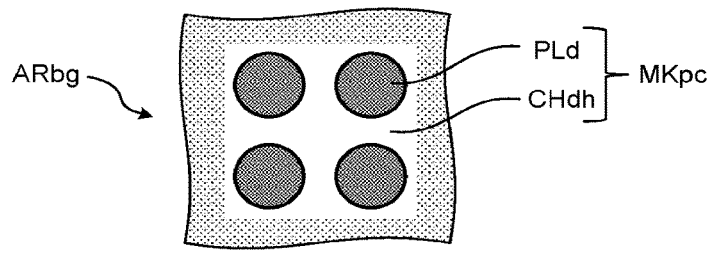

FIGS. 18C and 18D illustrate aspects when the mark MKpc of the misalignment mark MK is observed using an electron microscope such as an inline SEM. Inline SEM enables the appearance of the outermost surface layer of the substrate Sub to be observed via the top surface and is also referred to as top-view SEM or the like.

The mark MKpc has a smaller pattern size than the marks MKp and MKc and is a fine pattern on the order of an actual pattern in the chip region ARc. Therefore, observation using an optical microscope is not possible and observation using an electron microscope is performed. However, only the outermost surface of the substrate Sub can be observed using an electron microscope without an optical technique.

Similarly to FIGS. 18A and 18B, FIG. 18C illustrates an aspect of a mark MKpc in region ARbg after forming a mask pattern MSK. In this state, only the mask pattern MSK in the outermost surface layer of the mark MKpc can be observed, and it is not possible to see through the dummy pillars PLd below the insulating layer 53.

FIG. 18D illustrates an aspect of the mark MKpc after forming the holes CHh and the dummy hole CHdh. That is, FIG. 18D illustrates an aspect when the state of the foregoing FIG. 16C is observed using an electron microscope. By removing the insulating layers 53 and 54 by etching using the aforementioned mask pattern MSK as a mask and forming the holes CHh and the dummy hole CHdh, the upper ends of the dummy pillars PLd are exposed at the bottom surface of the dummy hole CHdh and it is possible to observe the dummy pillars PLd. It is therefore possible to observe the dummy hole CHdh and the dummy pillars PLd simultaneously.

In the example illustrated in FIG. 18D, four dummy pillars PLd are formed without a bias in the center section of the bottom surface of the dummy hole CHdh. In this state, even for an actual pattern in chip region ARc, it is presumed that the holes CHh formed in the insulating layers 53 and 54 are arranged so as to be superposed on the pillars PL.

Note that a more accurate misalignment inspection is possible if the amount of displacement between the barycenter of the dummy pillars PLd and the barycenter of the dummy hole CHdh, of the entire mark MKpc, including not only region ARbg illustrated in FIG. 18D but also the neighboring region ARsm, is observed.

Thus, by confirming that the marks MKp and MKc are in the state of FIG. 18A at the time of mask pattern formation and confirming that the mark MKpc after formation of the dummy hole CHdh is in the state of FIG. 18D, it is revealed whether the holes CHh have been formed correctly on the pillars PL.

(Misalignment Inspection Method)

Figure 19:
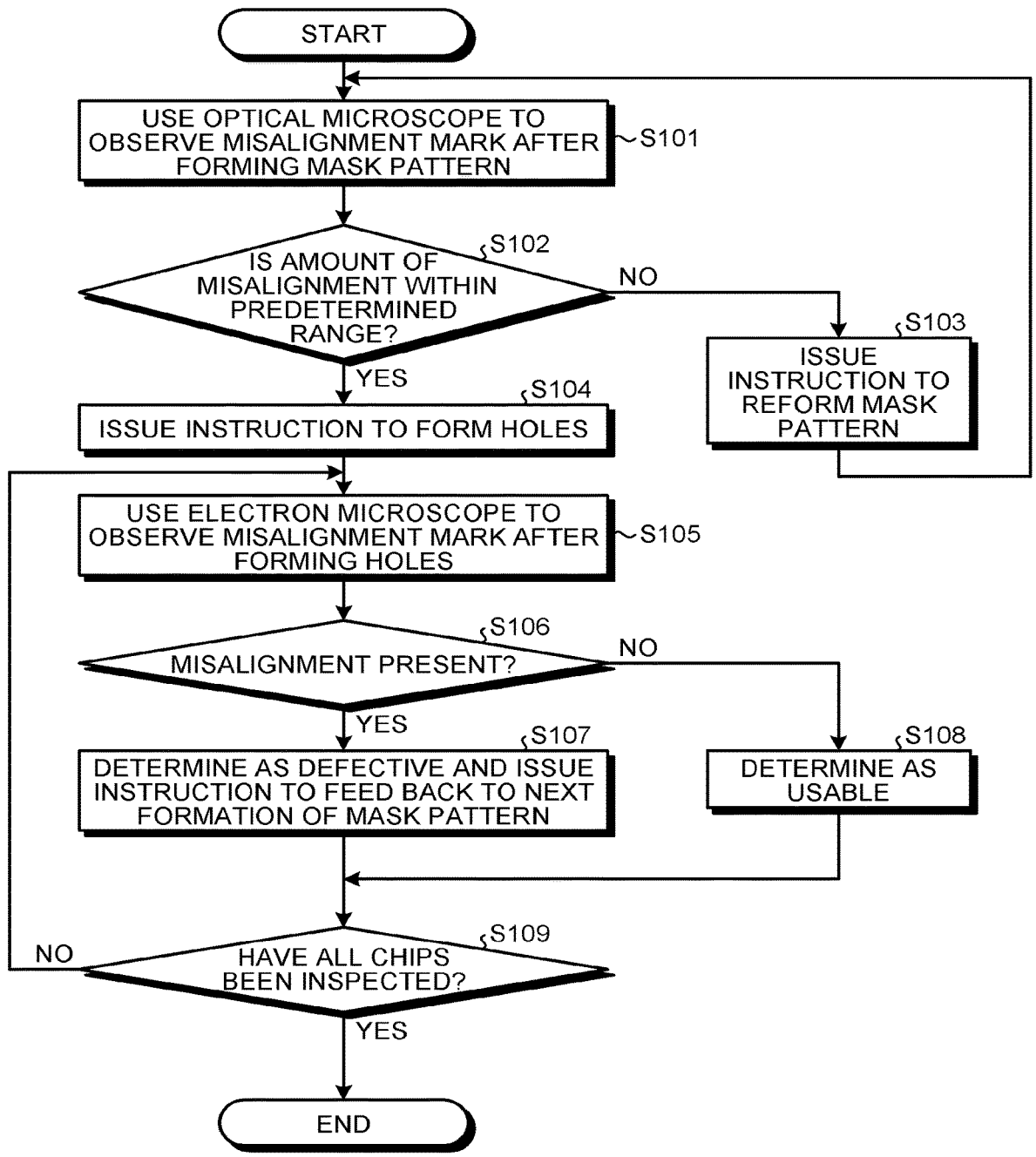
FIG. 19 is a flow diagram illustrating an example of a procedure in a misalignment inspection method using the misalignment mark according to the first embodiment.

Next, an example of a misalignment inspection method using the misalignment mark MK according to the first embodiment will be described using FIG. 19. FIG. 19 is a flow diagram illustrating an example of a procedure in a misalignment inspection method using the misalignment mark MK according to the first embodiment. The misalignment inspection method according to the first embodiment is carried out as part of the method for manufacturing the semiconductor memory device 1 according to the first embodiment.

As illustrated in FIG. 19, a predetermined misalignment mark MK of the substrate Sub, whereon a mask pattern is formed for forming the holes CHh, is observed by an optical microscope (step S101).

It is determined whether or not the amount of misalignment of the marks MKp and MKc of the misalignment mark MK is within a permissible predetermined range (step S102).

If the amount of misalignment is not within the predetermined range (step S102: No), an instruction to reform the mask pattern is issued (step S103) and steps S101 and S102 are repeated until the misalignment is within the predetermined range.

If the amount of misalignment is within the predetermined range (step S102: Yes), an instruction is issued to form the holes CHh and the dummy hole CHdh by etching the insulating layers 53 and 54 by using a mask pattern for which misalignment is within the predetermined range as a mask (step S104).

The misalignment mark MK of a predetermined chip of the substrate Sub in which the holes CHh and the dummy hole CHdh have been formed is observed using an electron microscope (step S105).

If misalignment has occurred (step S106: Yes), it is determined that the chip is defective, and the misalignment result is fed back at the time of the next mask pattern formation (step S107). The misalignment result feedback may be applied to the substrate Sub following the substrate Sub in which the misalignment has occurred or may be applied to the lot following the lot in which the misalignment has occurred, for example.

If misalignment has not occurred (step S106: No), it is determined that the chip is usable (step S108).

It is determined whether or not all the chips on the substrate Sub have undergone misalignment inspection (step S109). If not all the chips have undergone inspection (step S109: No), the processing from step S105 onwards is repeated for the next chip. If all the chips have undergone inspection (step S109: Yes), the processing is terminated.

The misalignment inspection method using the misalignment mark MK according to the first embodiment is completed as described above.

Holes for forming plugs atop the pillars are formed in the process for manufacturing a semiconductor memory device such as a three-dimensional nonvolatile memory. At such time, an inspection of misalignment of the mask pattern with respect to the pillars is sometimes carried out by observing a grating-type misalignment mark and the like by an optical microscope, for example.

Nevertheless, even if this kind of misalignment inspection is passed, there are cases where misalignment occurs between the pillars and the holes above the pillars in an actual pattern. The present inventors discovered that one reason for this misalignment is that the pillars and the misalignment mark for the pillars sometimes are formed inclined. When the inclined misalignment mark is viewed through the top surface, sometimes the upper end of the mark to be aligned cannot be accurately detected and hence the hole pattern is set in a position spaced apart from atop the pillars. In this case, it is not possible to detect whether or not misalignment between the actual pillars and holes has occurred or to detect the extent of the misalignment.

According to the semiconductor memory device 1 of the first embodiment, the misalignment mark MK includes marks MKp and MKc enabling misalignment inspection using an optical microscope and the mark MKpc enabling misalignment inspection using an electron microscope. It is thus possible to determine the existence of misalignment between actual pillars PL and holes CHh and the amount of misalignment therebetween from the existence of misalignment between the dummy pillars PLd and dummy hole CHdh of the mark MKpc and the amount of misalignment therebetween.

Figure 20A:
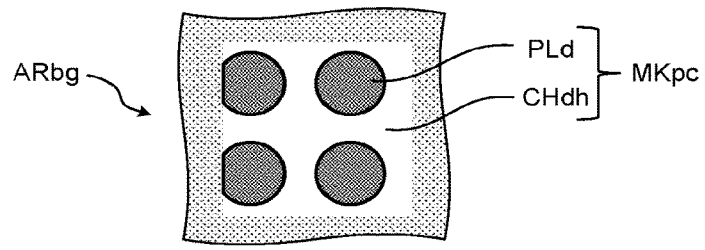
FIGS. 20A to 20C are schematic diagrams illustrating a case where misalignment has occurred in the marks according to the first embodiment.
Figure 20B:
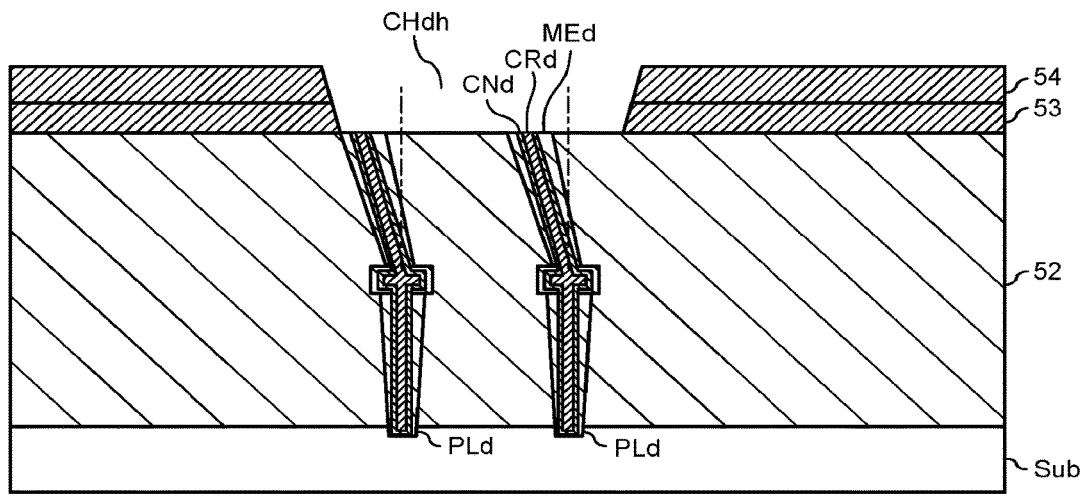
Figure 20C:
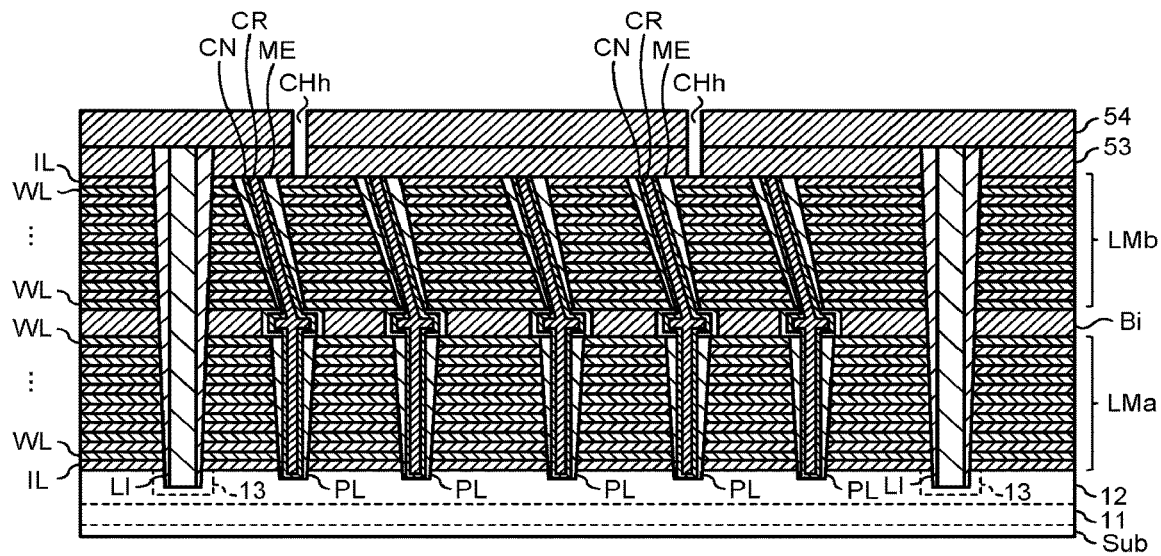

FIGS. 20A to 20C are schematic diagrams illustrating a case where misalignment has occurred in the mark MKpc according to the first embodiment. In FIGS. 20A to 20C, it is assumed that an inspection using the marks MKp and MKc has been passed.

FIG. 20A illustrates a state where misalignment is observed in the mark MKpc using an electron microscope after formation of the holes CHh and the dummy hole CHdh. According to the results of observing the mark MKpc, misalignment toward the right side of the page of the dummy hole CHdh relative to the dummy pillars PLd has occurred.

One reason for such misalignment is inclination of the dummy pillars PLd. It is thought that the dummy pillars PLd are inclined because ions is incident into the substrate Sub diagonally due to the gradient of a plasma sheath, or the like, when using etching to form the dummy holes LMHd and UMHd by plasma processing, for example.

As illustrated in FIG. 20B, if a cross-section of the mark MKpc in which misalignment has occurred is observed, the inclination of the upper portions of the dummy pillars PLd caused by the inclination of the upper dummy holes UMHd when at least the upper dummy holes UMHd are formed will be observed. In a misalignment inspection by an optical microscope using the marks MKp and MKc, suppose that, for example, an area close to the middle of the side of an inclined mark MKp is detected as the position of the mark MKp and that the misalignment of mark MKc with respect to mark MKp is then assumed to be within the permissible predetermined range; such a situation may actually lead to the dummy hole CHdh, formed in response to the ensuing etching instruction, being misaligned with the upper ends of the dummy pillars PLd.

As illustrated in FIG. 20C, if the cross-section of the memory portion MEM is observed when misalignment of the mark MKpc has occurred, inclination of the upper portions of the pillars PL caused by inclination during forming of the memory holes UMH is observed. Similarly to the dummy hole CHdh, misalignment of the holes CHh with respect to the pillars PL is also induced in FIG. 20C as an example. Thus, the diagonal incident of ions makes the same impact on both the dummy pillars PLd and the pillars PL.

Hence, if the misalignment of the mark MKpc is observed using an electron microscope, the existence of misalignment between the pillars PL and holes CHh in the actual pattern and the amount of misalignment therebetween can be quantified.

Thus, according to the semiconductor memory device 1 of the first embodiment, because the existence of misalignment between the pillars PL and holes CHh is revealed, it is possible to determine whether a chip is usable or defective. Furthermore, because the amount of misalignment between the pillars PL and holes CHh can be quantified, the quantification results can be fed back at the time of forming the next mask pattern MSK.

According to the semiconductor memory device 1 of the first embodiment, the misalignment mark MK is arranged in the kerf region ARk. Stress is generated between the stacked bodies LMa and LMb and the bulky insulating layer 52 of in the peripheral region. The actual pattern arranged within the stacked bodies LMa and LMb is subjected to strain that is caused by such stress, and misalignment between the pillars PL and the plugs CH may also occur for this reason. Because the misalignment mark MK is arranged in the kerf region ARk where the impact of stress-induced strain is low, the amount of misalignment occurring to the marks MKp and MKc can be quantified by being isolated from other factors causing misalignment such as stress-induced strain or the like.

According to the semiconductor memory device 1 of the first embodiment, the marks MKp and MKc and the mark MKpc are all arranged within the misalignment inspection region ARm. That is, the mark MKpc is disposed within the marks MKp and MKc or in the vicinity of the marks MKp and MKc such as on the outside edge of the marks MKp and MKc. Thus, the results of inspecting the misalignment between the marks MKp and MKc and the mark MKpc in similar peripheral environments can be compared. Accordingly, the amount of misalignment can be quantified more accurately.

Second Embodiment

A second embodiment will be described in detail hereinbelow with reference to the drawings. The semiconductor memory device according to the second embodiment differs from the foregoing first embodiment in that the misalignment mark is configured to enable the inspection of misalignment between the contact CS connected to the transistor TR and the wiring layer MX connected to the contact CS.

Note that, in the second embodiment, the vertical orientation of the semiconductor memory device according to the second embodiment is prescribed by taking, as a reference, the tier where the pillars PL are arranged and the tier where the wiring layer MX is disposed. In other words, the vertical orientation of the semiconductor memory device according to the second embodiment is prescribed by assuming that the first tier where the pillars PL are arranged is below the second tier where the wiring layer MX is disposed.

(Configuration Example of Semiconductor Memory Device)

Figure 21B:
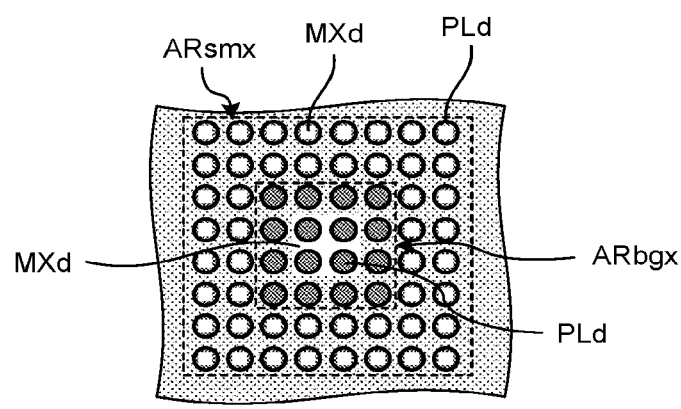
FIGS. 21A and 21B are plan views illustrating a configuration example of a misalignment mark of a semiconductor memory device according to a second embodiment.
Figure 21A:
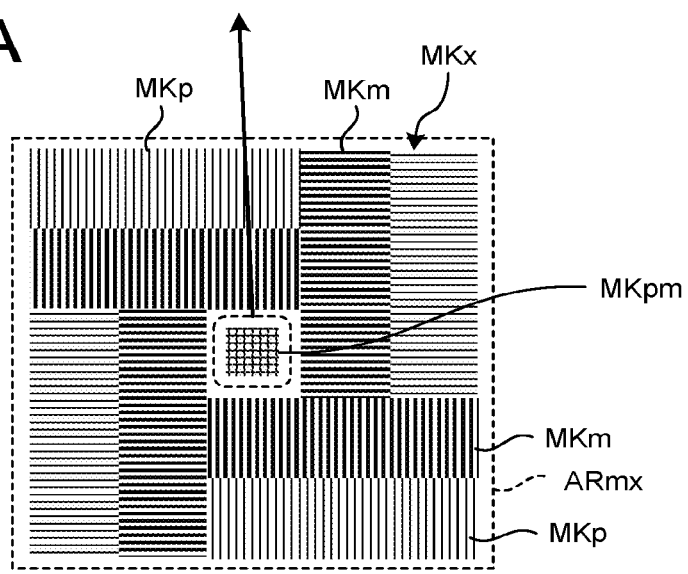

FIGS. 21A and 21B are plan views illustrating a configuration example of a misalignment mark MKx of a semiconductor memory device according to the second embodiment. The misalignment mark MKx of the second embodiment is also disposed in the kerf region of the semiconductor memory device.

As illustrated in FIG. 21A, the misalignment mark MKx includes mark MKp, mark MKm, and a mark MKpm.

The mark MKp is configured similarly to the mark MKp of the first embodiment. The mark MKm is formed in parallel with the formation of the wiring layer MX, in the tier where the wiring layer MX is formed. The misalignment mark MKx is configured as an AIM mark in which grating-like marks MKp and MKm are combined, for example. However, the misalignment mark MKx may also be of another type.

As illustrated in FIG. 21B, the mark MKpm has a region ARsmx and a region ARbgx, and these regions ARsmx and ARbgx each include dummy pillars PLd and dummy wiring layers MXd.

The dummy pillars PLd are configured similarly to the dummy pillars PLd of the first embodiment.

The dummy wiring layers MXd are formed in parallel with the formation of the wiring layer MX, in the tier where the wiring layer MX is formed. The dummy wiring layer MXd in the region ARsmx has the same size as the size of the wiring layer MX in a width direction, for example, and is disposed such that one dummy wiring layer MXd is superposed on one dummy pillar PLd. The dummy wiring layer MXd in the region ARbgx has a larger size than the size of the wiring layer MX in the width direction, for example, and is disposed such that one dummy wiring layer MXd is superposed on a plurality of dummy pillars PLd.

The mark MKpm is disposed in the center section of the combined marks MKp and MKm or close to the outside edge of the marks MKp and MKc, or the like, for example. The region where the marks MKp, MKm, and MKpm are arranged is called the misalignment inspection region ARmx.

The misalignment mark MKm is used in inspecting misalignment of the wiring layer MX with respect to the contact CS and the like in the lower layer during formation of the wiring layer MX in the process of manufacturing the semiconductor memory device according to the second embodiment. That is, misalignment between the contact CS and the wiring layer MX is inspected indirectly by using the mark MKp for the pillars PL.

Figure 22A:
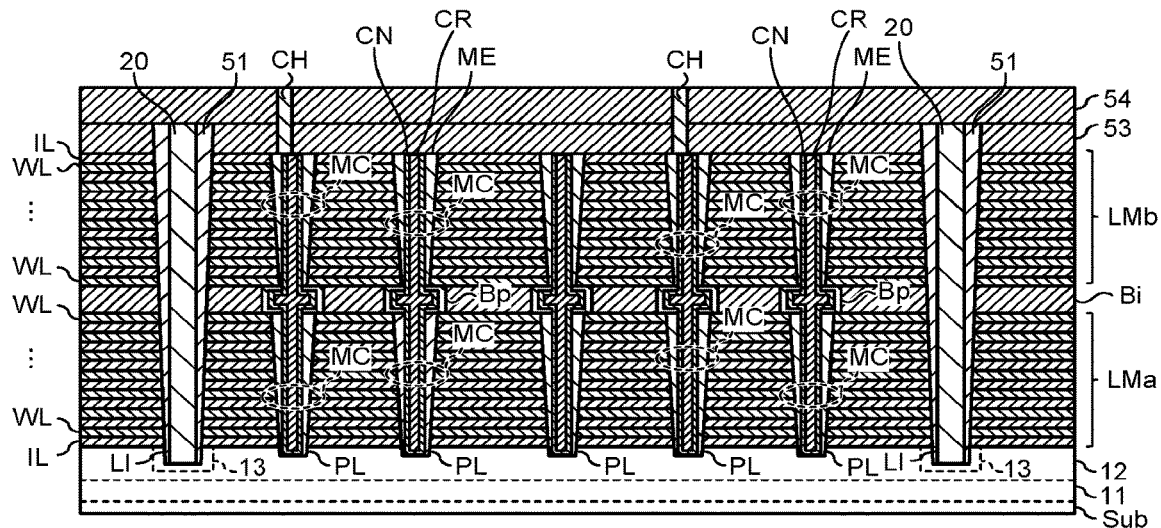
FIGS. 22A to 22C are cross-sectional views illustrating a configuration example of the semiconductor memory device according to the second embodiment.
Figure 22B:
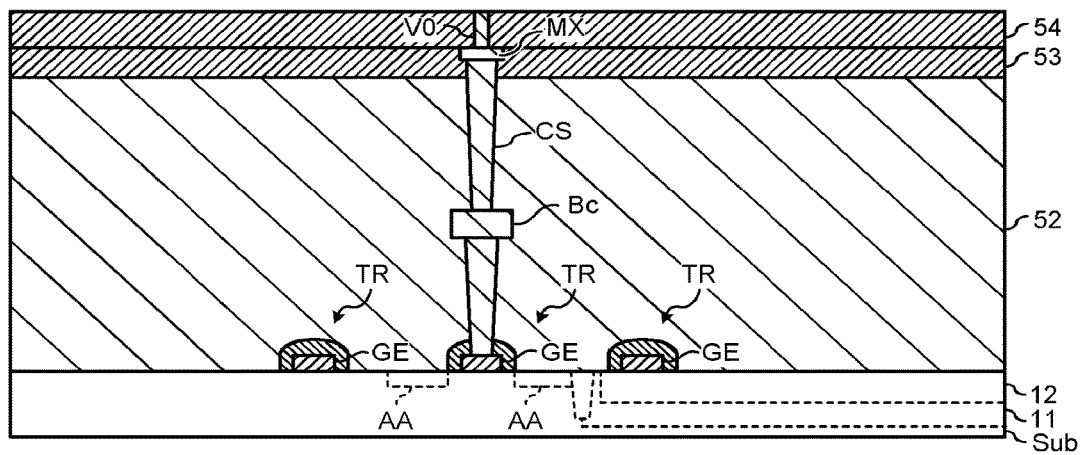
Figure 22C:
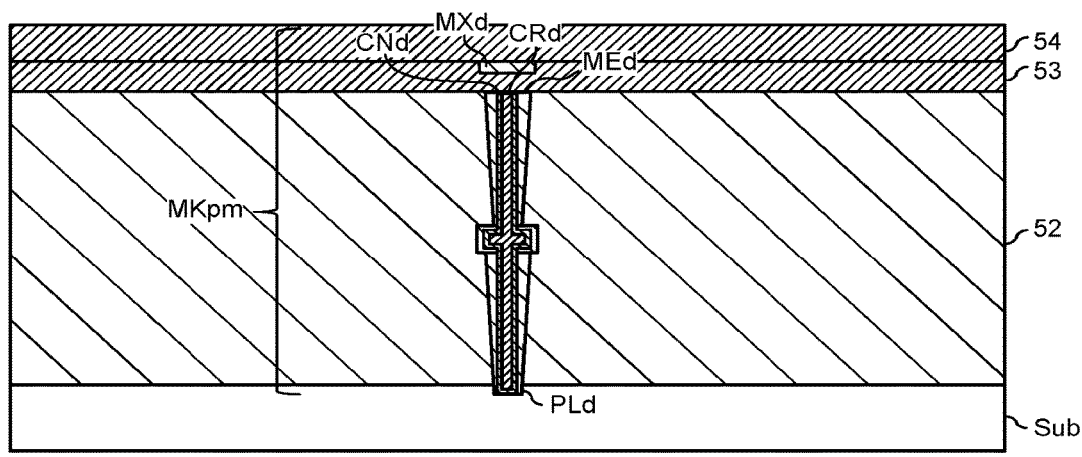

FIGS. 22A to 22C are cross-sectional views illustrating a configuration example of the semiconductor memory device according to the second embodiment.

As illustrated in FIG. 22A, the memory portion of the semiconductor memory device according to the second embodiment is provided with the same configuration as the first embodiment. As illustrated in FIG. 22B, the peripheral circuits of the semiconductor memory device according to the second embodiment are provided with the same configuration as the first embodiment.

Note that, also in the second embodiment, a tier in which the stacked bodies LMa and LMb in which the pillars PL are arranged is sometimes called the first tier. On the other hand, according to the second embodiment, a tier of the insulating layer 53 where the wiring layer MX is disposed, which is the tier upper than the first tier, is sometimes called the second tier. The wiring layer MX disposed in the tier upper than the pillars PL is an example of a first upper structure. The plug V0 and the upper-layer wiring, or the like, of the plug V0, which are upper than the wiring layer MX, may also be included in the first upper structure.

FIG. 22C is a cross-sectional view of the region ARsmx where the dummy wiring layer MXd, which is the same size as the size of the wiring layer MX in the width direction, is disposed.

As illustrated in FIG. 22C, the dummy wiring layer MXd is disposed in the same second tier as the wiring layer MX, that is, in the surface layer portion of the insulating layer 53. Furthermore, the dummy wiring layer MXd is configured from the same type of conductive material as the wiring layer MX. However, the dummy wiring layer MXd may also be configured from an insulating material such as an $SiO_2$ layer or the like. The dummy wiring layer MXd is disposed above the dummy pillar PLd so as to be superposed on the dummy pillar PLd, for example.

Note that the dummy wiring layer MXd, which is disposed in the second tier upper than the first tier where the dummy pillars PLd are arranged, that is, the insulating layer 52, is an example of a second upper structure.

The misalignment inspection using the mark MKpm of the misalignment mark MKx is performed by a sampling inspection using an electron microscope such as a cross-section SEM. In other words, the misalignment inspection using the mark MKpm is a destructive inspection and is a sampling inspection in which a predetermined substrate Sub is inspected at regular or irregular intervals rather than performing an all-product inspection.

Figure 23A:
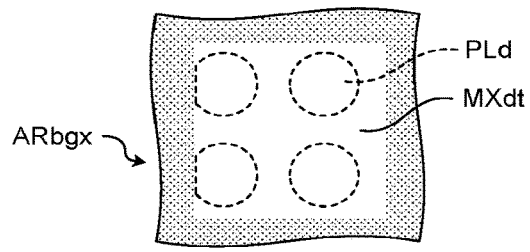
FIGS. 23A to 23C are schematic diagrams illustrating a case where misalignment has occurred in the mark according to the second embodiment.
Figure 23B:
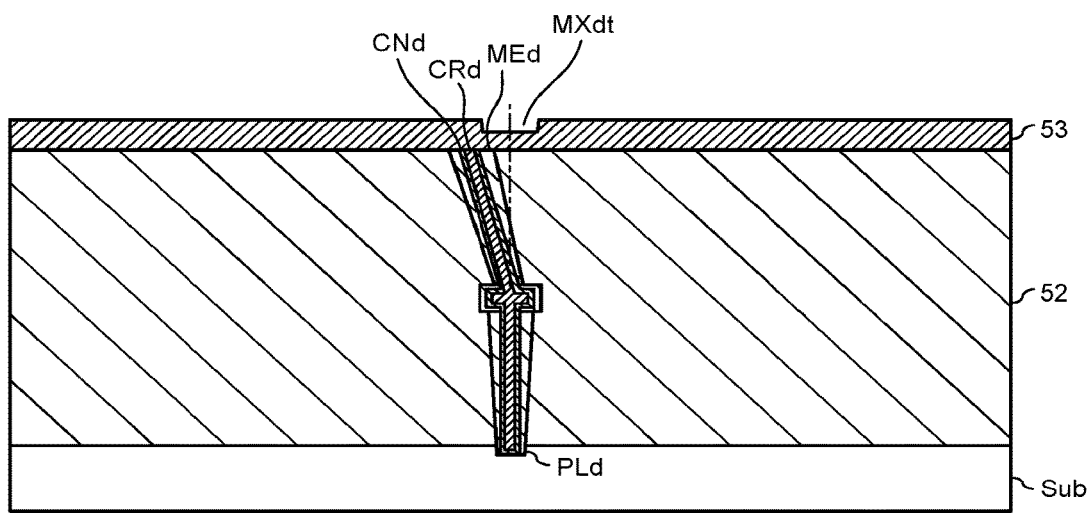
Figure 23C:
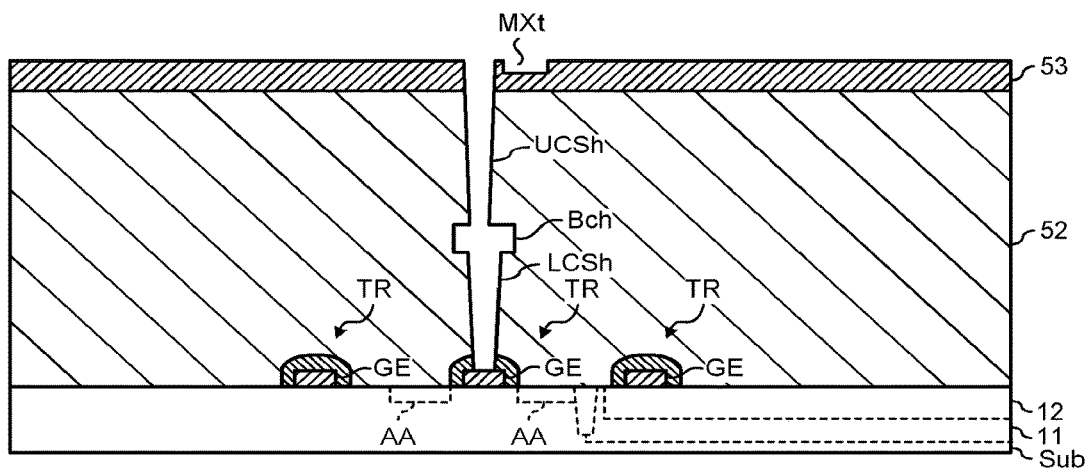

FIGS. 23A to 23C are schematic diagrams illustrating a case where misalignment has occurred in the mark MKpm according to the second embodiment. In FIGS. 23A to 23C, it is assumed that an inspection using the marks MKp and MKm has been passed.

FIG. 23A illustrates aspects in a case where the mark MKpm in the region ARbgx is observed using an electron microscope such as a top view SEM after forming the groove MXt for the wiring layer MX and a dummy groove MXdt for the dummy wiring layer MXd. As illustrated in FIG. 23A, only the dummy groove MXdt formed in the outermost surface of the substrate Sub can be observed using an electron microscope. This is because, like the groove MXt, the dummy groove MXdt is formed in the surface layer part of the insulating layer 53 and the dummy pillars PLd are not exposed at the bottom surface of the dummy groove MXdt.

FIG. 23B illustrates an aspect in which the mark MKpm in region ARsmx of the substrate Sub being inspected in the sampling inspection is observed using an electron microscope such as a cross-section SEM. As illustrated in FIG. 23B, an inclination in the dummy pillar PLd is generated in a predetermined chip of the substrate Sub being inspected, and therefore misalignment with respect to the dummy pillar PLd is generated for the dummy groove MXdt.

As illustrated in FIG. 23C, if the cross-section of a peripheral circuit is observed in a case where misalignment of the mark MKpm has occurred, misalignment will also occur between the groove MXt for forming the wiring layer MX and the contact hole UCSh connected to the transistor TR.

Hence, if the cross-section of the mark MKpm is observed using an electron microscope, the existence of misalignment between the groove MXt and the contact hole UCSh in the actual pattern and the amount of misalignment therebetween can be quantified.

The substrate Sub used for the misalignment inspection through observation of the cross-section of the mark MKpm is discarded. The result obtained in the misalignment inspection is fed back to the next substrate Sub or lot.

Note that, although the state directly after forming the dummy groove MXdt is observed in FIG. 23B, the misalignment inspection by cross-section observation using an electron microscope may also be performed at any time after forming the dummy groove MXdt. However, in order to eliminate any effect on the subsequent manufacturing process, the misalignment inspection is preferably performed as soon as possible after forming the dummy groove MXdt.

Furthermore, although the mark MKpm in region ARsmx is observed in FIG. 23B, misalignment inspection may also be performed by observing the cross-section of the mark MKpm in region ARbgx. However, it is thought that observation of the mark MKpm in region ARsmx where the dummy groove MXdt is formed with the same size as the size of groove MXt in the width direction yields data even closer to the actual pattern and that the extent of misalignment is also easily ascertained intuitively.

According to the semiconductor memory device of the second embodiment, the misalignment mark MKx includes marks MKp and MKm enabling misalignment inspection using an optical microscope and the mark MKpm enabling inspection of misalignment between the dummy pillar PLd and dummy groove MXdt using an electron microscope. It is thus possible to indirectly determine the existence of misalignment between the contact hole UCSh and the groove MXt and the amount of misalignment therebetween.

According to the semiconductor memory device of the second embodiment, arrangement of the dummy pillar PLd in the mark MKpm and the dummy groove MXdt in positions coinciding with each other in a top view is sought. Thus, the dummy groove MXdt is then disposed in the neighborhood of directly above the dummy pillar PLd, unlike the marks MKp and MKm, or the like, which are arranged in positions spaced apart from each other by several μm in a top view, for example, thereby making misalignment inspection easier.

Modification Example

An inspection object of a modification example of the second embodiment will be described next using FIGS. 24A to 24C. The inspection object of the modification example differs from that of the foregoing second embodiment in having a mark MKpmd that enables misalignment inspection using an inline SEM or the like.

Figure 24A:
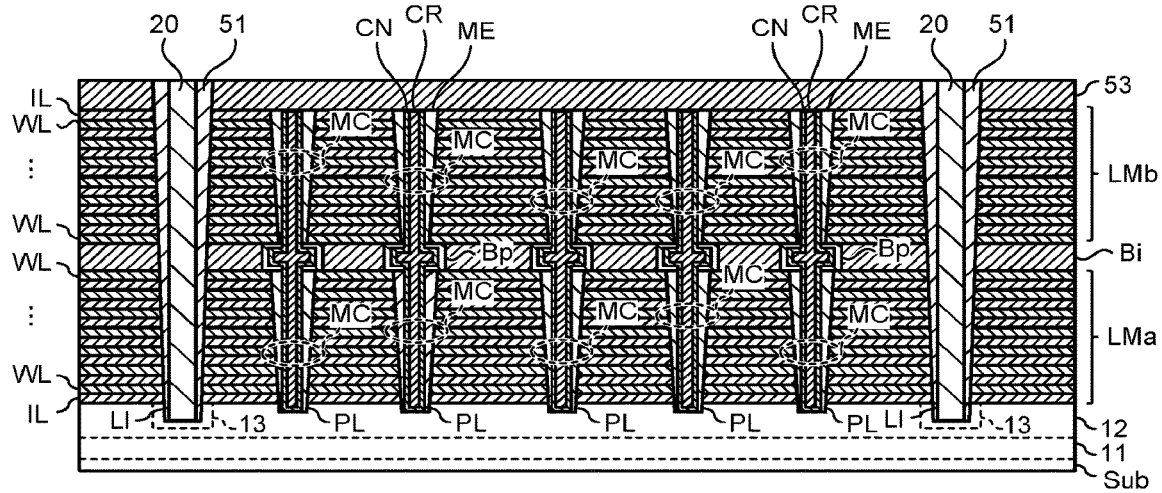
FIGS. 24A to 24C are cross-sectional views illustrating a configuration example of an inspection object according to a modification example of the second embodiment.
Figure 24B:
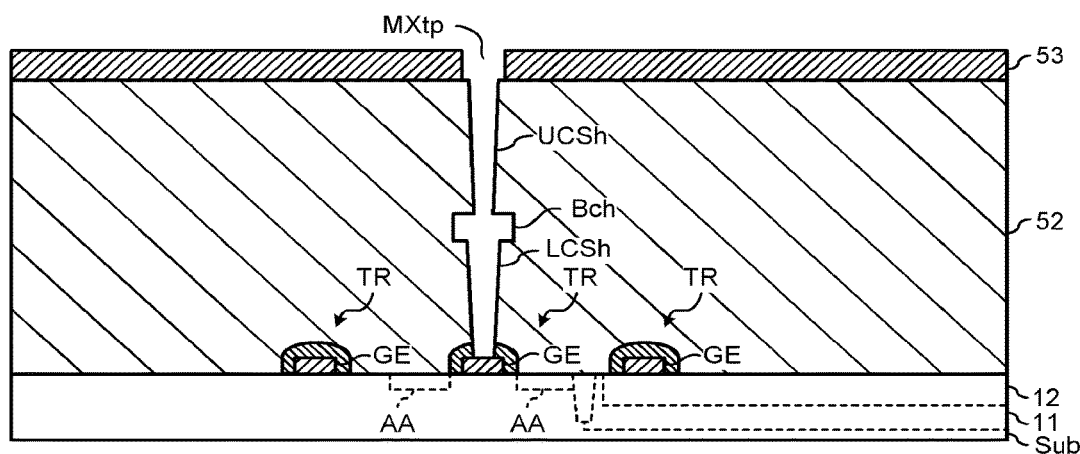
Figure 24C:
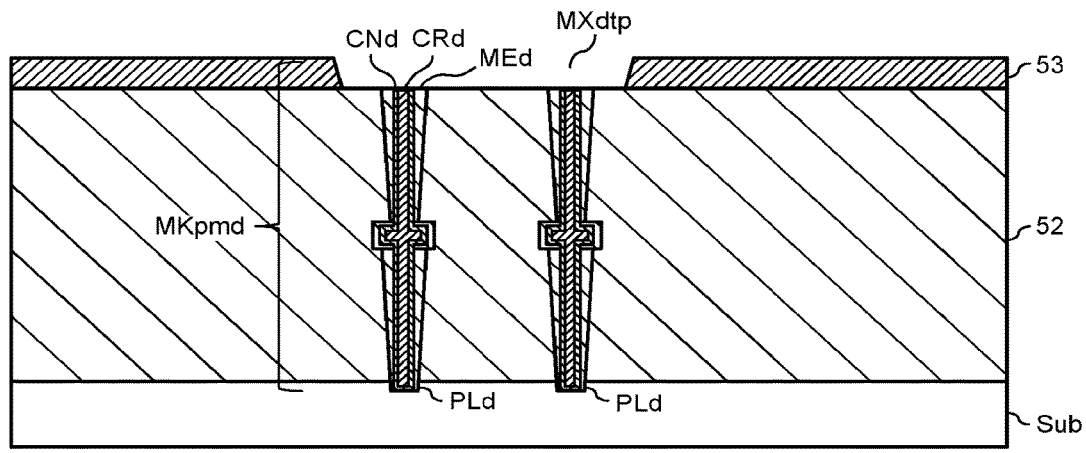

FIGS. 24A to 24C are cross-sectional views illustrating a configuration example of an inspection object according to a modification example of the second embodiment. The inspection object of the modification example is an unfinished article of a semiconductor memory device that is sampled in a misalignment inspection by undergoing a different process from the regular manufacturing process of the semiconductor memory device. In other words, the misalignment inspection of the modification example is also premised on a sampling inspection. By adopting a process that differs from a regular process, inline misalignment inspections are enabled for the inspection object of the modification example.

As illustrated in FIG. 24A, replacement with word lines WL has been performed in the memory portion, and formation up to and including the contacts LI has been completed.

As illustrated in FIG. 24B, in the peripheral circuit, the contact holes UCSh and LCSh, which are connected to each other via the bonding portion Bch, have been formed. In addition, a penetrating groove MXtp that penetrates the insulating layer 53 is formed in the insulating layer 53.

As illustrated in FIG. 24C, in the misalignment inspection region where the mark MKpmd is disposed, a plurality of dummy pillars PLd, and a dummy penetrating groove MXdtp disposed straddling the plurality of dummy pillars PLd, are formed. The dummy penetrating groove MXdtp penetrates the insulating layer 53.

Thus, a dummy penetrating groove MXdtp that intentionally penetrates the insulating layer 53 is formed in the inspection object of the modification example so as to expose the dummy pillars PLd at the bottom surface of the dummy penetrating groove MXdtp. Accordingly, misalignment inspection can be performed by using an electron microscope such as a top view SEM to observe both the dummy penetrating groove MXdtp and the dummy pillars PLd via the top surface.

The dummy penetrating groove MXdtp that penetrates the insulating layer 53 can be formed by additionally processing a recess to serve as a dummy groove after, as usual, forming a recess which is to serve as the dummy groove in the surface layer portion of the insulating layer 53. Alternatively, batch formation of the dummy penetrating groove MXdtp is enabled by configuring, from the outset, a longer processing time for performing the etching. In addition, the penetrating groove MXtp also comes to penetrate the insulating layer 53 in the peripheral circuit.

The inspection object used for the misalignment inspection using the mark MKpmd is discarded. The result obtained in the misalignment inspection is fed back to the next substrate Sub or lot.

According to the semiconductor memory device of the modification example, the mark MKpmd includes the dummy penetrating groove MXdtp, at the bottom surface of which the dummy pillars PLd are exposed. Inline misalignment inspection using an electron microscope is thus enabled. Accordingly, the results of the misalignment inspection can be obtained more simply and quickly, and the results can be fed back to the next substrate Sub or lot.

Note that, although the semiconductor memory device includes stacked bodies LMa and LMb which are configured in two tiers in the foregoing first and second embodiments and modification examples thereof, the semiconductor memory device is not limited to such a configuration. The semiconductor memory device may also include a stacked body in a single tier or may include stacked bodies in three or more tiers.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a stacked body disposed in a first tier, the stacked body including a plurality of conductive layers stacked via an insulating layer;
a first pillar that extends in the stacked body in a stacking direction of the stacked body, the first pillar having a plurality of memory cells formed at respective intersections of the first pillar and at least part of the plurality of conductive layers;
a first upper structure disposed in a second tier upper than the first tier; and
a misalignment mark including a first mark disposed in the first tier of a misalignment inspection region outside the stacked body and a second mark disposed in the second tier of the misalignment inspection region and for inspecting misalignment between the first tier and the second tier,
wherein the misalignment mark further includes:
a second pillar that extends in the first tier of the misalignment inspection region in the stacking direction; and
a second upper structure disposed in the second tier of the misalignment inspection region and superposed on the second pillar in a top view.

2. The semiconductor memory device according to claim 1,
wherein the first upper structure is a first contact that is connected to the first pillar.

3. The semiconductor memory device according to claim 2,
wherein
the second pillar includes a plurality of second pillars, and
the second upper structure lies across a region that is superposed on the plurality of second pillars in a top view.

4. The semiconductor memory device according to claim 3,
wherein a size of a top surface of each of the second pillars is substantially equal to a size of a top surface of the first pillar, and
a size of a top surface of the second upper structure is larger than a size of a top surface of the first upper structure.

5. The semiconductor memory device according to claim 3,
wherein a top surface of each of the second pillars is in contact with a bottom surface of the second upper structure.

6. The semiconductor memory device according to claim 1, further comprising:
a peripheral circuit that is disposed outside the stacked body and contributes to operation of the memory cells; and
a second contact that is connected to the peripheral circuit and extends in the first tier in the stacking direction,
wherein the first upper structure is a wiring layer that is electrically connected to the second contact.

7. The semiconductor memory device according to claim 6,
wherein
the second pillar includes a plurality of second pillars, and
the second upper structure is kept within a region that is superposed on one of the second pillars in a top view.

8. The semiconductor memory device according to claim 7,
wherein a size of a top surface of each of the second pillars is substantially equal to a size of a top surface of the first pillar, and
a size of a top surface of the second upper structure is substantially equal to a size of a top surface of the first upper structure in a width direction.

9. The semiconductor memory device according to claim 7,
wherein a top surface of each of the second pillars is separated apart from a bottom surface of the second upper structure.

10. The semiconductor memory device according to claim 1,
wherein the first mark and the second mark are arranged in a peripheral edge section of the misalignment inspection region, and
the second pillar and the second upper structure are arranged in a center section of the misalignment inspection region surrounded by the first mark and the second mark.

11. The semiconductor memory device according to claim 10,
wherein the second mark is not superposed on the first mark in a top view.

12. The semiconductor memory device according to claim 1,
wherein the first pillar includes a plurality of first pillars and the second pillar includes a plurality of second pillars, and
at least a part of the plurality of the first pillars and at least a part of the plurality of the second pillars have a portion that is inclined relative to the stacking direction.

* * * * *